United States Patent
Koh et al.

(10) Patent No.: US 9,412,604 B2
(45) Date of Patent: Aug. 9, 2016

(54) METHODS OF MANUFACTURING SEMICONDUCTOR DEVICE

(71) Applicant: Samsung Electronics Co., Ltd., Suwon-si, Gyeonggi-do (KR)

(72) Inventors: Cha-won Koh, Yongin-si (KR); Hyun-woo Kim, Seongnam-si (KR); Jong-soo Kim, Suwon-si (KR); Jin Park, Yongin-si (KR); Hyung-rae Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/692,330

(22) Filed: Apr. 21, 2015

(65) Prior Publication Data
US 2016/0049306 A1    Feb. 18, 2016

(30) Foreign Application Priority Data

Aug. 14, 2014  (KR) .......................... 10-2014-0106226

(51) Int. Cl.
| | |
|---|---|
| *H01L 21/30* | (2006.01) |
| *H01L 21/306* | (2006.01) |
| *H01L 21/308* | (2006.01) |
| *H01L 21/027* | (2006.01) |
| *H01L 21/02* | (2006.01) |

(52) U.S. Cl.
CPC ...... *H01L 21/30604* (2013.01); *H01L 21/0274* (2013.01); *H01L 21/02118* (2013.01); *H01L 21/02343* (2013.01); *H01L 21/02345* (2013.01); *H01L 21/3081* (2013.01); *H01L 21/3085* (2013.01); *H01L 21/3086* (2013.01)

(58) Field of Classification Search
CPC .................. H01L 21/02118; H01L 21/02343
See application file for complete search history.

(56) References Cited

U.S. PATENT DOCUMENTS

| | | | |
|---|---|---|---|
| 6,180,320 | B1 | 1/2001 | Saito et al. |
| 7,329,477 | B2 | 2/2008 | Jung et al. |
| 7,862,988 | B2 | 1/2011 | Koh et al. |
| 8,314,036 | B2 | 11/2012 | Moon et al. |
| 8,431,331 | B2 | 4/2013 | Kang et al. |
| 8,852,979 | B2 | 10/2014 | Min et al. |
| 2008/0121616 | A1 | 5/2008 | Chen |
| 2010/0170868 | A1 | 7/2010 | Lin et al. |

(Continued)

FOREIGN PATENT DOCUMENTS

| | | |
|---|---|---|
| KR | 1020070037098 A | 4/2007 |
| KR | 1020100085661 A | 7/2010 |
| KR | 1020110011368 A | 2/2011 |

(Continued)

*Primary Examiner* — Mohammad Islam
*Assistant Examiner* — Ankush Singal
(74) *Attorney, Agent, or Firm* — Myers Bigel & Sibley, P.A.

(57) ABSTRACT

The present inventive concept provides methods of manufacturing a semiconductor device including forming an inner mask layer on an etching target film, the inner mask layer including a polymer; forming a porous film on the etching target film, the porous film covering the inner mask layer; supplying an acid source to an outer surface area of the inner mask layer through the porous film; inducing a chemical reaction of the polymer included in the inner mask layer in the outer surface area by using the acid source; forming inner mask patterns by removing a chemically reacted portion of the inner mask layer; and etching the etching target film by using at least a portion of the porous film and the inner mask patterns as an etching mask.

10 Claims, 22 Drawing Sheets

(56) References Cited

U.S. PATENT DOCUMENTS

2011/0244689 A1* 10/2011 Han et al. .................. 438/702
2012/0064724 A1* 3/2012 Lee et al. .................. 438/703

FOREIGN PATENT DOCUMENTS

KR  1020110109561 A  10/2011
KR  1020120037882 A  4/2012

* cited by examiner

METHODS OF MANUFACTURING SEMICONDUCTOR DEVICE

CROSS-REFERENCE TO RELATED APPLICATIONS

This application claims the benefit of Korean Patent Application No. 10-2014-0106226, filed on Aug. 14, 2014, the disclosure of which is incorporated herein by reference in its entirety.

BACKGROUND

The inventive concept relates to methods of manufacturing a semiconductor device, and more particularly, to methods of manufacturing a semiconductor device including a process of forming micro pitch patterns exceeding a resolution limitation of existing exposure equipment by using processes including a triple patterning process.

Micro patterning is indispensable in manufacturing a highly integrated semiconductor device. An individual device needs to be as small as possible in order to integrate many devices in a narrow area. To this end, a pitch that is a sum of a width of each of the patterns to be formed and a space between the patterns needs to be small. As a design rule of a semiconductor device rapidly decreases, there is a limit to forming micro pitch patterns at least due to a resolution limitation of a photolithography process for forming a pattern necessary for achieving the semiconductor device. A multiple patterning technology that has been proposed up to now to manufacture a highly scaled and integrated semiconductor device increases the number of layers used for multiple patterning, which generally creates a complicated process and increases the processing cost. Accordingly, there is a need for a multiple patterning technology capable of forming micro patterns exceeding the resolution limitation of the photolithography process at a simple and/or relatively low processing cost while reducing a number of times of applications of the photolithography process.

SUMMARY

The inventive concept provides a method of manufacturing a semiconductor device capable of more readily implementing micro pitch patterns exceeding a resolution limitation of a photolithography process with simplified processing and/or relatively low processing cost.

According to an aspect of the inventive concept, there is provided a method of manufacturing a semiconductor device including forming an inner mask layer on an etching target film, the inner mask layer including a polymer; forming a porous film on the etching target film, the porous film covering the inner mask layer; supplying an acid source to an outer surface area of the inner mask layer through the porous film; inducing a chemical reaction of the polymer included in the inner mask layer in the outer surface area by using the acid source; forming inner mask patterns by removing a chemically reacted part of the inner mask layer; and etching the etching target film by using at least a part of the porous film and the inner mask patterns as an etching mask.

The porous film may be formed to conformally cover exposed surfaces of the etching target film and the inner mask layer.

The inner mask layer may be formed of a chemically amplified resist including a polymer having an acid-labile protecting group.

The acid source may include acid, a photoacid generator (PAG), or a thermoacid generator (TAG).

The method may further include: after forming the porous film, before supplying the acid source to the outer surface area of the inner mask layer through the porous film, forming an acid source coating layer facing side walls of the inner mask layer with the porous film interposed therebetween, wherein the supplying of the acid source to the outer surface area includes: diffusing the acid source included in the acid source coating layer into the inner mask layer.

The method may further include: after forming the porous film, before supplying the acid source to the outer surface area of the inner mask layer through the porous film, forming an acid source coating layer facing side walls of the inner mask layer with the porous film interposed therebetween; and thermally processing the acid source coating layer.

The method may further include: after forming the porous film, before supplying the acid source to the outer surface area of the inner mask layer through the porous film, forming an acid source coating layer facing side walls of the inner mask layer with the porous film interposed therebetween; and irradiating light onto the acid source coating layer.

The method may further include: after forming the porous film, before supplying the acid source to the outer surface area of the inner mask layer through the porous film, forming an acid source coating layer facing side walls of the inner mask layer with the porous film interposed therebetween; irradiating light onto the acid source coating layer; and thermally processing the acid source coating layer.

The method may further include: after forming the porous film, before supplying the acid source to the outer surface area of the inner mask layer through the porous film, forming an acid source coating layer facing side walls of the inner mask layer with the porous film interposed therebetween, wherein the acid source coating layer is formed of a mixture of water, a soluble polymer, and the acid source.

The porous film may include an oxide film, a nitride film, an oxynitride film, a polysilicon film, or a combination of these.

According to another aspect of the inventive concept, there is provided a method of manufacturing a semiconductor device including forming photoresist patterns on an etching target film; forming a porous film on the etching target film, the porous film covering the photoresist patterns; forming an acid source coating layer covering side walls of the photoresist patterns with the porous film interposed therebetween; inducing a chemical reaction of the photoresist patterns in outer surface areas of the photoresist patterns by diffusing acid sources to the outer surface areas from the acid source coating layer through the porous film; forming reduced photoresist patterns by developing the photoresist patterns; and etching the etching target film by using at least a part of the porous film and at least a part of the reduced photoresist patterns as an etching mask.

Heights of the reduced photoresist patterns may be lower than those of the photoresist patterns that have not been reduced.

The method may further include: after inducing the chemical reaction of the photoresist patterns in the outer surface areas of the photoresist patterns by diffusing the acid sources to the outer surface areas from the acid source coating layer through the porous film, before developing the photoresist patterns, exposing a top surface of the porous film by removing the acid source coating layer remaining on the porous film; and exposing the photoresist patterns by removing a part of the porous film.

The method may further include: after inducing the chemical reaction of the photoresist patterns in the outer surface areas of the photoresist patterns by diffusing the acid sources to the outer surface areas from the acid source coating layer through the porous film, before developing the photoresist patterns, exposing a top surface of the porous film by removing the acid source coating layer remaining on the porous film; forming a capping film covering the porous film; and exposing the photoresist patterns by removing a part of each of the porous film and the capping film, wherein the etching of the etching target film includes: etching the etching target film by using at least a part of the porous film, at least a part of the reduced photoresist patterns, and at least a part of the capping film as an etching mask.

The porous film and the capping film may be formed of the same material.

The porous film and the capping film may be formed of different materials.

The method may further include: before forming the porous film, forming acid anti-diffusion barrier patterns covering top surfaces of the photoresist patterns, wherein the forming of the porous film includes: forming the porous film to cover the side walls of the photoresist patterns and top surfaces of the acid anti-diffusion barrier patterns.

According to another aspect of the inventive concept, there is provided a method of manufacturing a semiconductor device including forming a feature layer on a substrate; forming a stack structure of photoresist patterns and acid anti-diffusion barrier patterns on the feature layer; forming a porous film on the feature layer, the porous film covering the stack structure; forming an acid source coating layer covering side walls of the photoresist patterns and top surfaces of the acid anti-diffusion barrier patterns with the porous film interposed therebetween; inducing a chemical reaction of the photoresist patterns in outer surface areas of the photoresist patterns by diffusing acid sources to the outer surface areas from the side walls of the photoresist patterns through the porous film from the acid source coating layer while inhibiting diffusion of acid through top surfaces of the photoresist patterns by using the acid anti-diffusion barrier patterns; removing the acid anti-diffusion barrier patterns; exposing the top surfaces of the photoresist patterns by removing a part of the porous film; forming reduced photoresist patterns by developing the photoresist patterns; and etching the feature layer by using at least a part of the porous film and the reduced photoresist patterns as an etching mask.

The acid anti-diffusion barrier patterns may include an organic compound containing silicon.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
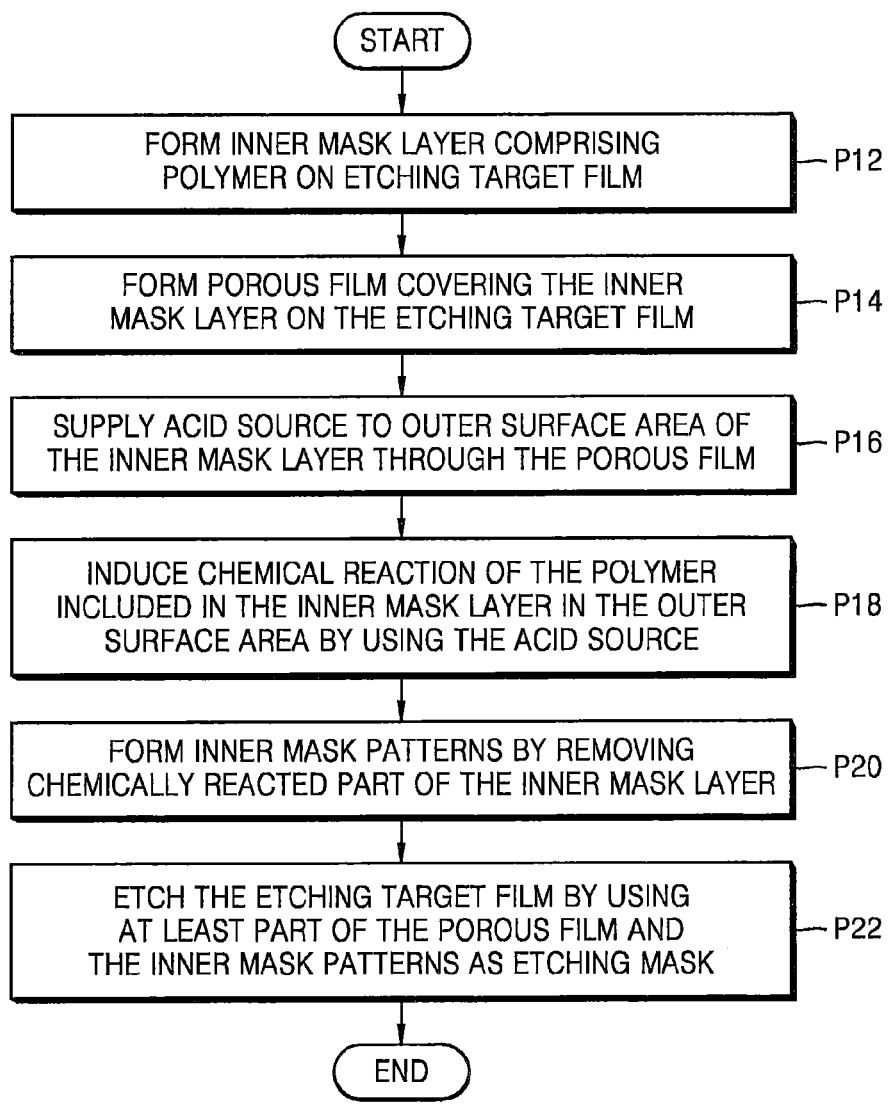
FIG. 1 is a flowchart of a method of manufacturing a semiconductor device, according to an embodiment of the inventive concept.

Hereinafter, the inventive concept will be described in detail by explaining exemplary embodiments of the invention with reference to the attached drawings. Like reference numerals in the drawings denote like elements, and thus their description will be omitted.

The inventive concept may, however, be embodied in many different forms and should not be construed as limited to the exemplary embodiments set forth herein. Rather, these embodiments are provided so that this disclosure will be thorough and complete, and will fully convey the scope of the inventive concept to those skilled in the art. In the drawings, lengths and sizes of layers and regions may be exaggerated for clarity.

Also, though terms like 'first' and 'second' are used to describe various elements, components, regions, layers, and/or portions in various embodiments of the inventive concept, the elements, components, regions, layers, and/or portions should not be limited by these terms. These terms are only used to distinguish one element, component, region, layer, or portion from another. Thus, a first element, component, region, layer or section discussed below could be termed a second element, component, region, layer or section without departing from the teachings of the inventive concept. Further, it will be understood that when an element or layer is referred to as being "on" or "connected to" another element or layer, it can be directly on or connected to the other element or layer or intervening elements or layers may be present. In the drawings, the thicknesses of layers and regions may be exaggerated for clarity. In contrast, if an element or layer is referred to as being directly on or directly connected to another element or layer, then no other intervening elements or layers are present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

When a certain embodiment can be embodied in a different manner, a specified process order may be performed in a different manner in order to be described. For example, two processes to be described sequentially may be substantially performed at the same time or may be performed in an order opposite to the order to be described.

As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

FIG. 1 is a flowchart of a method of manufacturing a semiconductor device, according to an embodiment of the inventive concept.

Referring to FIG. 1, in process P12, an inner mask layer including a polymer is formed on an etching target film.

In some embodiments, the etching target film may be a substrate or a feature layer formed on the substrate. The substrate may include a semiconductor such as silicon (Si) or germanium (Ge), or a compound semiconductor such as silicon germanium (SiGe), silicon carbide (SiC), gallium arsenide (GaAs), indium arsenide (InAs), or indium phosphide (InP). In other some embodiments, the substrate may have a silicon on insulator (SOI) structure. The substrate may include a conductive area, for example, a well doped with impurities or a structure doped with impurities. The feature layer may be a conductive film, a dielectric film, an insulating film, or a combination of these. In an example, the feature layer may include a film formed of metal, an alloy, a metal carbide, a metal nitride, a metal oxynitride, a metal oxycarbide, a semiconductor, a polysilicon, an oxide, a nitride, or a combination of these but is not limited thereto. In another example, the feature layer may configure a hard mask layer. In this case, the feature layer may be formed of various film materials according to a type of the substrate. For example, the feature layer may be formed of an oxide film, a nitride film, a SiCN film, a polysilicon film, or a combination of these.

The inner mask layer may be formed of a chemically amplified resist including a polymer having an acid-labile protecting group.

In some embodiments, the inner mask layer may include a photoresist film including the polymer whose polarity increases by the addition of acid. The photoresist film may include the polymer having the acid-labile protecting group and a photoacid generator (PAG).

In some embodiments, the photoresist film may include a resist for a KrF excimer laser (248 nm), a resist for an ArF excimer laser (193 nm), a resist for an $F_2$ excimer laser (157 nm), or a resist for extreme ultraviolet (EUV) (13.5 nm).

For example, the photoresist film may be formed of a methacrylate-based polymer. The methacrylate-based polymer may be an aliphatic methacrylate-based polymer. For example, the photosensitive polymer may be polymethyl methacrylate (PMMA), poly(t-butyl methacrylate), poly (methacrylic acid), poly(norbornyl methacrylate), a copolymer or terpolymer of repeating units of the methacrylate-based polymers, or a combination of these. The polymers may have a structure replaced by various types of acid-labile protecting groups. The acid-labile protecting groups may be selected from the group consisting of tert-butoxycarbonyl (t-BOC), isopropyl nord carbonyl, 2-methyl-2-adamantyl, 3-tetrahydrofuranyl, 3-oxocyclohexyl, γ-butyllactone-3-yl, mavaloniclactone, γ-butyrolactone-2-yl, 3-methyl-γ-butyrolactone-3-yl, 2-tetrahydropyranyl, 2-tetrahydrofuranyl, 2,3-propylenecarbonate-1-yl, 1-methoxyethyl, 1-ethoxyethyl, 1-(2-methoxyethoxy)ethyl, 1-(2-acetoxyethoxy)ethyl, t-buthoxycarbonylmethyl, methoxymethyl, ethoxymethyl, trimethoxysilyl, and triethoxysilyl but is not limited thereto.

In process P14 of FIG. 1, a porous film covering the inner mask layer is formed on the etching target film.

The porous film may be formed to conformally cover the etching target film and an exposed surface of the inner mask layer.

In some embodiments, the porous film may include the oxide film, the nitride film, an oxynitride film, a polysilicon, or a combination of these. The porous film may be formed through an atomic layer deposition (ALD) process. However, the inventive concept is not limited to the above materials of the porous film and the above forming process but the porous film may be formed by using various materials and processes within the scope thereof.

In process P16 of FIG. 1, an acid source is supplied to an outer surface area of the inner mask layer through the porous film.

The acid source may be formed of an acid or potential acid.

In some embodiments, the acid source used may be one selected from the group consisting of, for example, $C_4F_9SO_3H$ (perfluorobutane sulfonic acid), $CF_3CO_2H$ (trifluoroacetic acid), and $CF_3SO_3H$ (trifluoromethanesulfonic acid).

In other embodiments, when the acid source is formed of the potential acid, the potential acid may be, for example, a thermoacid generator (TAG) that generates acid by heat. The TAG may be constituted by an aliphatic or alicyclic compound. For example, the TAG may be constituted by at least one compound selected from the group consisting of cyclohexyl nonafluorobutanesulfonate, norbornyl nonafluorobutanesulfonate, tricyclodecanyl nonafluorobutanesulfonate, adamantyl nonafluorobutanesulfonate, cyclohexyl nonafluorobutanecarbonate, norbornyl nonafluorobutanecarbonate, tricyclodecanyl nonafluorobutanecarbonate, adamantyl nonafluorobutanecarbonate, cyclohexyl nonafluorobutanephosphonate, norbornyl nonafluorobutanephosphonate, tricyclodecanyl nonafluorobutanephosphonate, and adamantyl nonafluorobutanephosphonate.

In other some embodiments, when the acid source is formed of the potential acid, the potential acid may be, for example, a photoacid generator (PAG). The PAG may generate acid when exposed to light selected from a KrF excimer laser (248 nm), an ArF excimer laser (193 nm), and an F2 excimer laser (157 nm). The PAG may be formed of triarylsulfonium salts, diaryliodonium salts, sulfonates, or a combination of these. For example, the PAG may be formed of triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris (alkylsulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide-nonaflate, triphenylsulfonium perfluorobutanesulfonate, triphenylsulfonium perfluorooctanesulfonate (PFOS), PFOS (diphenyliodonium PFOS), PFOS (methoxydiphenyliodonium PFOS), di-t-butyldiphenyliodonium triflate, PFOS (N-hydroxysuccinimide PFOS), PFOS (norbornene-dicarboximide PFOS), or a combination of these.

In some embodiments, in process P16, an acid source coating layer including the acid source may be used to supply the acid source to the outer surface area of the inner mask layer through the porous film.

The acid source coating layer may be formed of a combination including water, a polymer, and the acid source as a main component.

In an embodiment, the polymer may include a soluble polymer. For example, the soluble polymer may include a repeating unit of at least one selected from the group consisting of an acrylamide-type monomer unit, a vinyl-type monomer units, alkylene glycol type monomer unit, a maleic anhydride monomer unit, ethyleneimine monomer unit, a monomer unit containing an oxazoline group, an acrylonitrile monomer unit containing, allyl amide monomer units, a 3,4-dihydropyran-monomer unit, and a 2,3-dihydro-furan monomer unit. Alternatively, the soluble polymer may include a copolymer including a pyrrolidone-based first repeating unit and a second repeating unit having a different structure from that of the first repeating unit. The second repeating unit may include at least one selected from the group consisting of an acrylamide-type monomer unit, a vinyl-type monomer units, an alkylene glycol type monomer unit, a maleic anhydride monomer unit, an ethyleneimine monomer unit, a monomer unit containing an oxazoline group, an acrylonitrile monomer unit, an allyl amide monomer unit, a 3,4-dihydropyran-monomer unit, and a 2,3-dihydro-furan monomer unit.

In another example, the polymer may include vinyl pyrrolidone, vinyl caprolactam, vinyl imidazole, vinyl piperidine, or vinyl pyrrolidine that may be used solely or in combination of two or more.

When the acid source coating layer includes water, the polymer, and the acid source, the acid source may include 0.01~50 wt % with respect to the total weight of the polymer.

As a method of forming the acid source coating layer, a process of coating an acid source composition formed of a combination of water, the soluble polymer, and the acid source formed of the soluble acid or the potential acid on the porous film formed in process P14 and then thermally processing a resultant of the acid source composition covering the porous film may be used. The resultant structure may be thermally processed at a temperature of about 30 to 200° C. for about 3 to 300 seconds but is not limited thereto. In some embodiments, the acid source coating layer may be formed at a room temperature. In this case, such thermal processing may be omitted.

In process P18 of FIG. 1, a chemical reaction of the polymer included in the inner mask layer is induced in the outer surface area of the inner mask layer by using the acid source.

To induce the chemical reaction of the polymer included in the inner mask layer, the inner mask layer including a diffused acid source may be thermally processed. The inner mask layer may be thermally processed at a temperature of about 30 to 200° C. for about 3 to 300 seconds but is not limited thereto.

During the chemical reaction of the polymer included in the inner mask layer, the polymer having the acid-labile protecting group included in the inner mask layer may be deprotected by the reaction due to acid from the acid source.

In process P20 of FIG. 1, an inner mask pattern is formed by removing a chemically reacted portion of the inner mask layer.

When a deprotection reaction of the polymer included in the inner mask layer takes place during process P18 of induction of the chemical reaction, an area of the inner mask layer in which the deprotection reaction of the polymer occurs may be in a soluble state by a developing solution including an alkaline aqueous solution. Accordingly, the chemically reacted portion of the inner mask layer may be removed by development using the developing solution. The developing solution may include a tetramethyl ammonium hydroxide (TMAH) solution. The TMAH solution may have a concentration of about 2 to 5 wt %.

In process P22 of FIG. 1, the etching target film is etched by using at least a part of the porous film and the inner mask pattern as an etching mask.

As a result of etching the etching target film, a plurality of feature patterns including a remaining part of the etching target film may be obtained. The feature patterns may include three feature patterns that are separated and transferred as three micro patterns from the single inner mask layer formed in process P12. Accordingly, a pattern tripling effect of obtaining three separated patterns from a single pattern may be obtained.

As described with reference to FIG. 1 above, a plurality of patterns repeatedly formed at a micro pitch exceeding a resolution limitation of a photolithography process by using a triple patterning process may be formed by using a low-cost simplified process that uses a single photolithography process. Thus, a semiconductor device having various structures may be easily formed by using the simplified process, and productivity may be increased by reducing a processing cost.

FIGS. 2A through 2H are cross-sectional views sequentially showing a method of manufacturing a semiconductor device, according to embodiments of the inventive concept.

Figure 2A:
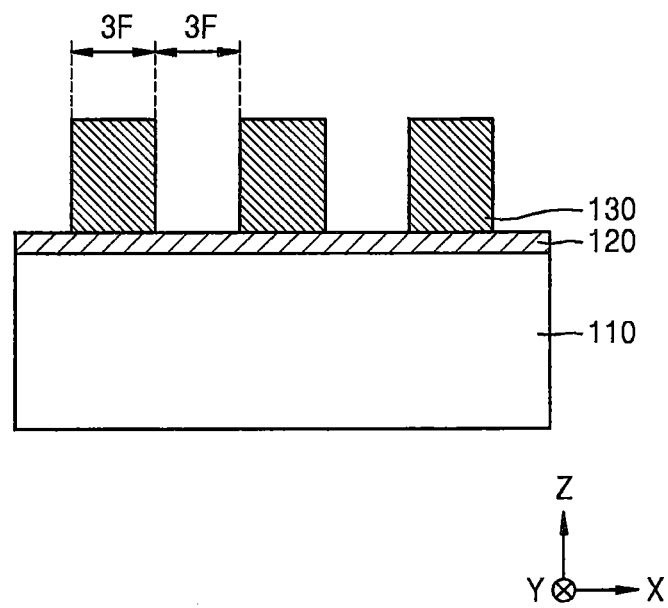
FIGS. 2A through 2H are cross-sectional views sequentially showing a method of manufacturing a semiconductor device, according to embodiments of the inventive concept.

Referring to FIG. 2A, a feature layer 120 that is an etching target film and a plurality of photoresist patterns 130 are sequentially formed on a substrate 110.

In some embodiments, the substrate 110 may include a semiconductor such as silicon (Si) or germanium (Ge), or a compound semiconductor such as silicon germanium (SiGe), silicon carbide (SiC), gallium arsenide (GaAs), indium arsenide (InAs), or indium phosphide (InP). In another example, the substrate 110 may have an SOI structure. The substrate 110 may include a conductive area, for example, a well doped with impurities or a structure doped with impurities.

The feature layer 120 may be a conductive film, a dielectric film, an insulating film, or a combination of these. In an example, the feature layer 120 may include a film formed of metal, an alloy, a metal carbide, a metal nitride, a metal oxynitride, a metal oxycarbide, a semiconductor, a polysilicon, an oxide, a nitride, or a combination of these but is not limited thereto. In another example, the feature layer 120 may configure a hard mask layer. In this case, the feature layer 120 may be formed of various film materials according to a type of the substrate 110. For example, the feature layer 120 may be formed of an oxide film, a nitride film, a SiCN film, a polysilicon film, or a combination of these.

The plurality of photoresist patterns 130 may be used as an inner mask layer used in process P12 of FIG. 1.

Detailed descriptions of materials of the plurality of photoresist patterns 130 are the same as those of the materials of the photoresist film provided with reference to process P12 of FIG. 1 above.

The plurality of photoresist patterns 130 may have a width 3F that is three times a feature size 1F of a pattern that is to be finally formed on the substrate 110 in a first direction (an X direction of FIG. 2A).

Planar shapes of the plurality of photoresist patterns 130 may include a plurality of line patterns in parallel extending in a second direction (a Y direction of FIG. 2A). However, the inventive concept is not limited to planar shapes, and the plurality of photoresist patterns 130 having various planar shapes may be formed.

Figure 2B:
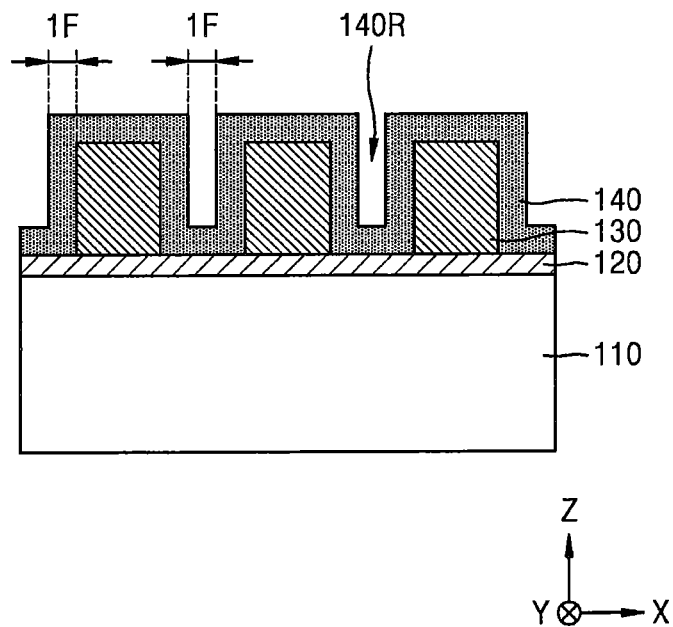

Referring to FIG. 2B, a porous film 140 is formed on the feature layer 120 and covers the plurality of photoresist patterns 130.

In some embodiments, the porous film 140 may include an oxide film, a nitride film, an oxynitride film, a polysilicon, or a combination of these.

The porous film 140 may be formed to conformally cover an exposed surface of the feature layer 120 and an exposed surface of the plurality of photoresist patterns 130. For example, the porous film 140 may be formed through an ALD process. In an example, the porous film 140 may be formed to cover at least side walls of the plurality of photoresist patterns 130 by a width of about 1F.

After the porous film 140 is formed, recess areas 140R having about the width 1F may be formed in the porous film 140 in spaces between the plurality of photoresist patterns 130.

Figure 2C:
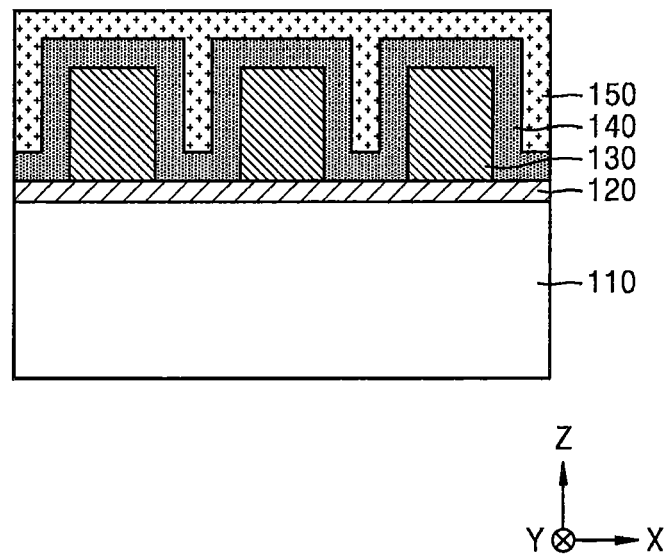

Referring to FIG. 2C, an acid source coating layer 150 is formed on the porous film 140.

The acid source coating layer 150 may be formed of a combination including water, a polymer, and an acid source as a main component. A detailed configuration of the acid source coating layer 150 is the same as described in the acid source coating layer used in process P16 of FIG. 1 above.

A method of forming the acid source coating layer 150 may use a process of coating an acid source composition formed of a combination of water, a soluble polymer, and the acid source on the porous film 140 and then thermally processing a resultant of the coated acid source composition. The resultant may be thermally processed at a temperature of about 30 to 200° C. for about 3 to 300 seconds but is not limited thereto. In some embodiments, the acid source coating layer 150 may be formed at a room temperature. In this case, such thermal processing may be omitted. In some embodiments, the acid source coating layer 150 may be present in a gel state or in an aqueous solution state.

Figure 2D:
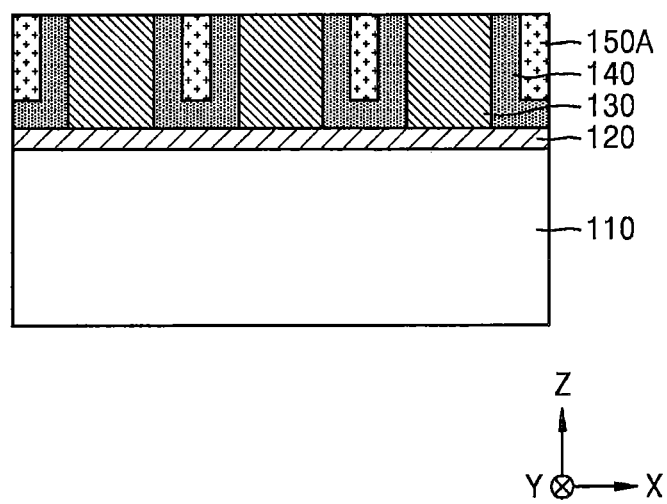

Referring to FIG. 2D, top surfaces of the plurality of photoresist patterns 130 are exposed by removing a part of the acid source coating layer 150 and a part of the porous film 140.

After the part of the acid source coating layer 150 and the part of the porous film 140 are removed, a remaining acid source coating layer 150A covers the side wall of each of the plurality of photoresist patterns 130 having the porous film 140 interposed therebetween. In some embodiments, an etchback process may be used to remove the part of the acid source coating layer 150 and the part of the porous film 140.

Figure 2E:
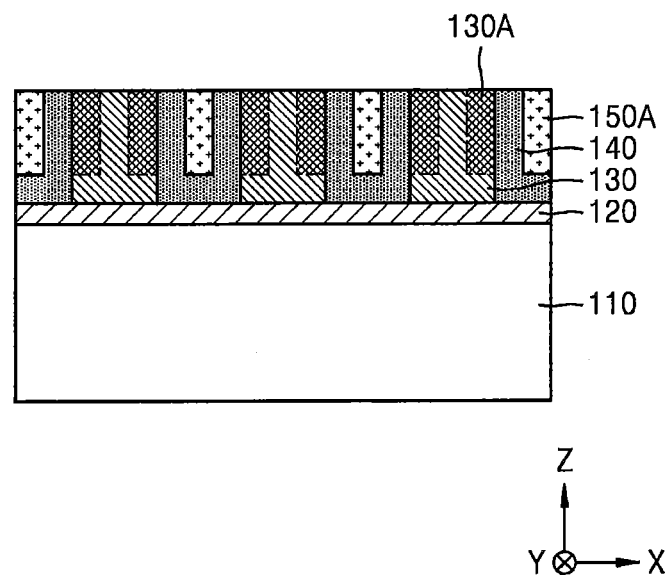

Referring to FIG. 2E, a chemical reaction of the plurality of photoresist patterns 130 is induced in outer surface areas 130A of the plurality of photoresist patterns 130 by diffusing the acid source to the outer surface areas 130A from the remaining acid source coating layer 150A through the porous film 140.

The outer surface areas 130A may include side walls of the plurality of photoresist patterns 130 facing the remaining acid source coating layer 150A having the porous film 140 interposed therebetween.

In some embodiments, to induce the chemical reaction of the plurality of photoresist patterns 130, a first thermal processing process for diffusing the acid source and a second thermal processing process for inducing the chemical reaction of the plurality of photoresist patterns 130 by using the diffused acid source may be sequentially performed. In some other embodiments, the first thermal processing process and the second thermal processing process may not be separately performed but diffusing the acid source and the chemical reaction of the plurality of photoresist patterns 130 using the diffused acid source may be simultaneously performed during the first thermal processing process. The first thermal processing process and the second thermal processing process may be performed at a temperature of about 80 to 150° C. for about 10 seconds to 5 minutes.

During the first thermal processing process and/or the second thermal processing process, acid sources included in the remaining acid source coating layer 150A may pass through the porous film 140 and may be diffused into the plurality of photoresist patterns 130.

When the acid source is formed of acid, acid included in the remaining acid source coating layer 150A may pass through the porous film 140 by using the first thermal processing process and/or the second thermal processing process and may be diffused into the plurality of photoresist patterns 130. A deprotection reaction of polymers included in the plurality of photoresist patterns 130 may be induced by the acid diffused into the plurality of photoresist patterns 130.

When the acid source is a TAG, a TAG included in the remaining acid source coating layer 150A may pass through the porous film 140 by using the first thermal processing process and/or the second thermal processing process and may be diffused into the plurality of photoresist patterns 130. Acid may be generated by heat applied during the first thermal processing process and/or the second thermal processing process from the TAG diffused into the plurality of photoresist patterns 130 so that the deprotection reaction of the polymers included in the plurality of photoresist patterns 130 may be induced. Alternatively, the acid may be generated from the TAG included in the remaining acid source coating layer 150A by the heat applied during the first thermal processing process and/or the second thermal processing process. The acid generated from the TAG may pass through the porous film 140 and may be diffused into the plurality of photoresist patterns 130.

When the acid source is a PAG, a process of irradiating light may be performed such that acid may be generated from the PAG. The process of irradiating light may be performed after forming the acid source coating layer 150 as described with reference to FIG. 2C above, removing a part of the acid source coating layer 150 and a part of the porous film 140 as described with reference to FIG. 2D above, or diffusing the acid source formed of the PAG to the outer surface areas 130A of the plurality of photoresist patterns 130 through the porous film 140 from the remaining acid source coating layer 150A according to the process described with reference to FIG. 2E above. In some embodiments, the PAG included in the remaining acid source coating layer 150A may pass through the porous film 140 by the heat applied during the first thermal processing process and/or the second thermal processing process and may be diffused into the plurality of photoresist patterns 130. Acid may be generated from the PAG diffused into the plurality of photoresist patterns 130 by irradiating the light so that a deprotection reaction of polymers included in the plurality of photoresist patterns 130 may be induced. Alternatively, before the first thermal processing process and/or the second thermal processing process are/is performed, acid may be generated from the PAG by irradiating the light onto the remaining acid source coating layer 150A, may pass through the porous film 140 by the heat applied during the first thermal processing process and/or the second thermal processing process, and may be diffused into the plurality of photoresist patterns 130.

In some embodiments, the light may be irradiated by using light selected from the group consisting of a KrF excimer laser (248 nm), an ArF excimer laser (193 nm), and an $F_2$ excimer laser (157 nm).

Polymers included in the outer surface areas 130A of the plurality of photoresist patterns 130 may not be protected by the acid diffused from the acid source coating layer 150A, and thus the outer surface areas 130A may be in a soluble state by a developing solution including an alkaline aqueous solution.

Figure 2F:
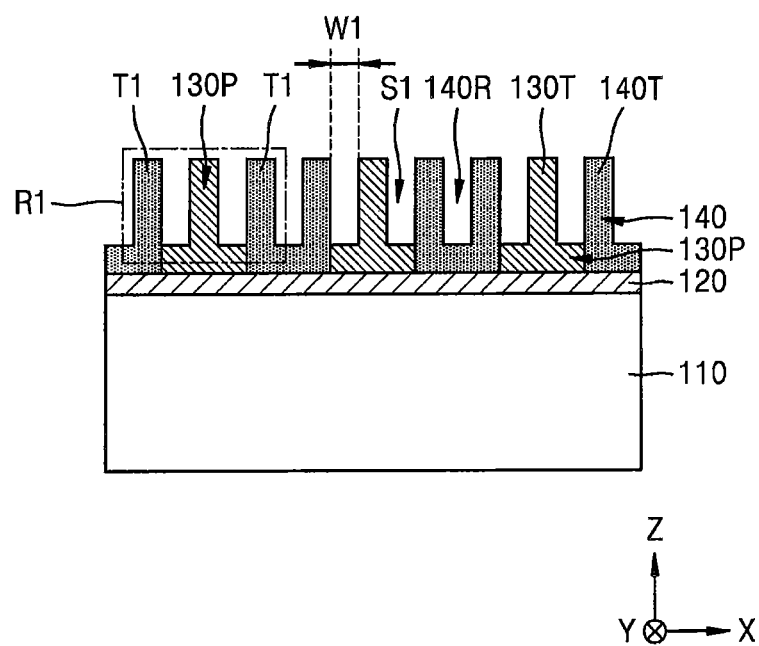

Referring to FIG. 2F, reduced photoresist patterns 130P that are remaining parts of the plurality of photoresist patterns 130 may be formed by developing the plurality of photoresist patterns 130 by using the alkaline aqueous solution and removing the outer surface areas 130A from the plurality of photoresist patterns 130.

The reduced photoresist patterns 130P may correspond to inner mask patterns formed in process P20 of FIG. 1. After the reduced photoresist patterns 130P are formed, a space S1 having a first width W1 may be formed in a first direction (in an X direction of FIG. 2A) between the reduced photoresist patterns 130P and the porous film 140. In some embodiments, the first width W1 of the space S1 may have the same size as the feature size 1F of a pattern that is to be finally formed but the inventive concept is not limited thereto.

The acid source coating layer 150A covering the porous film 140 may be removed simultaneously with the removal of the outer surface areas 130A from the plurality of photoresist patterns 130 through a developing process. As a result, top surfaces of the recessed areas 140R of the porous film 140 may be exposed to the outside.

Each of the reduced photoresist patterns 130P and the porous film 140 has the width 1F, and includes a plurality of protrusions 130T and 140T for an etching mask spaced apart from each other by the width 1F.

As shown in a dotted area R1 of FIG. 2F, the porous film 140 includes a pair of tripling portions T1, respectively, facing both side walls of the protrusions 130T and 140T of the reduced photoresist patterns 130P in locations spaced apart from the both side walls.

Figure 2G:
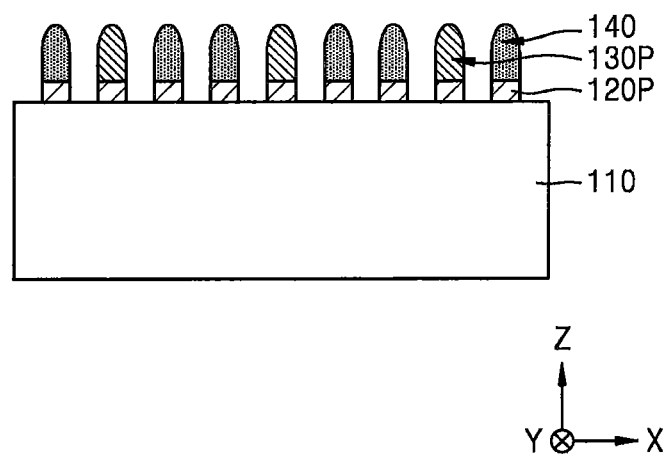

Referring to FIG. 2G, a plurality of feature patterns 120P are formed by etching the feature layer 120 by using at least a part of the reduced photoresist patterns 130P and at least a part of the porous film 140.

Figure 2H:
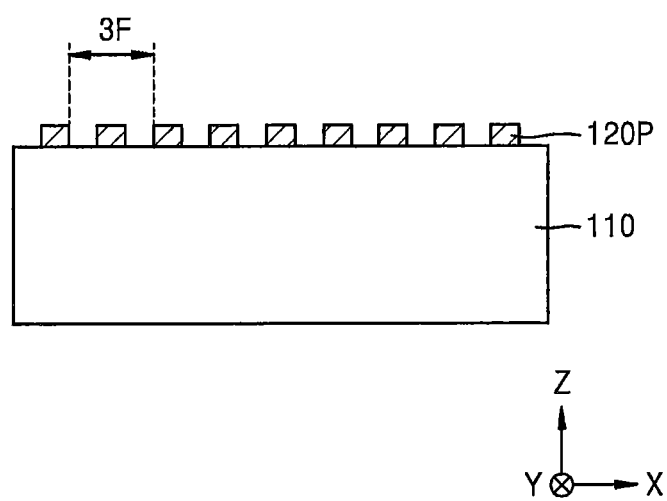

Referring to FIG. 2H, top surfaces of the feature patterns 120P are exposed by removing extra films remaining on the feature patterns 120P.

The feature patterns 120P may include a plurality of line pattern parts repeatedly disposed by the width 1F having the space 1F in a first direction (in an X direction of FIG. 2H).

The method of manufacturing the semiconductor device described with reference to FIGS. 2A through 2H may obtain a pattern tripling effect of separating one of the photoresist patterns 130 into three patterns in the first direction (in the X direction of FIG. 2H) as described with reference to FIG. 2A above. As such, patterns repeatedly formed at a micro pitch exceeding a resolution limitation of a photolithography process by using the triple patterning process may be formed by using a low-cost simplified process that uses a single photolithography process. Thus, the semiconductor device having various structures may be easily formed by using the simplified process, and productivity may be increased by reducing a processing cost.

FIGS. 3A through 3D are cross-sectional views sequentially showing a method of manufacturing a semiconductor device, according to another embodiment of the inventive concept. The same reference numerals between FIGS. 3A through 3D and FIGS. 2A through 2H denote the same elements, and thus detailed descriptions thereof are omitted here.

The method of FIGS. 3A through 3D is generally similar to that of FIGS. 2A through 2H, except that the method of FIGS. 3A through 3D includes a process of forming the acid source coating layer 150, covering not only side walls of the plurality of photoresist patterns 130 but also top surfaces thereof with the porous film 140, and diffusing acid sources to outer surface areas 230A of the side walls and the top surfaces of the plurality of photoresist patterns 130 through the porous film 140.

Figure 3A:
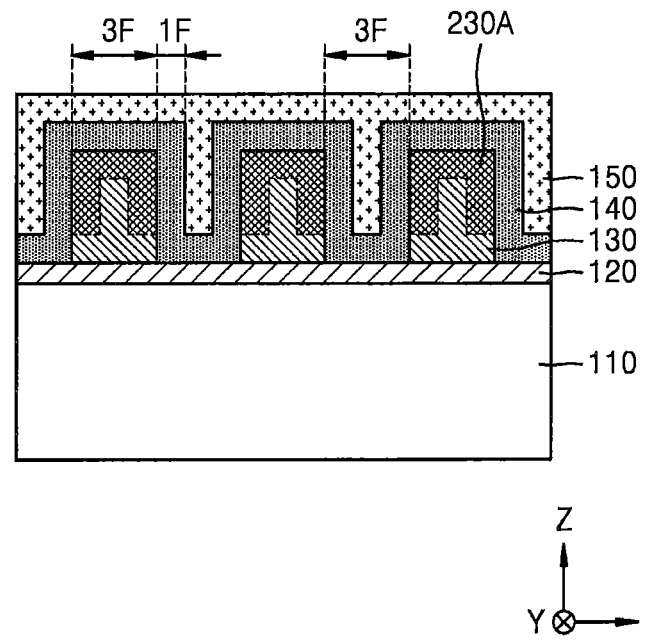
FIGS. 3A through 3D are cross-sectional views sequentially showing a method of manufacturing a semiconductor device, according to another embodiment of the inventive concept.

Referring to FIG. 3A, in the same manner as described with reference to FIGS. 2A through 2C above, after the feature layer 120 and the plurality of photoresist patterns 130 are sequentially formed on the substrate 110, the porous film 140 is formed on the etching target film 120 and covers the plurality of photoresist patterns 130, and the acid source coating layer 150 is formed on the porous film 140.

Thereafter, in a similar manner as described with reference to FIG. 2E above, a chemical reaction of the plurality of photoresist patterns 130 is induced in the outer surface areas 230A of the plurality of photoresist patterns 130 by diffusing the acid sources in the outer surface areas 230A from the acid source coating layer 150 through the porous film 140.

The outer surface areas 230A may include the side walls and the top surfaces of the plurality of photoresist patterns 130 facing the acid source coating layer 150 having the porous film 140 interposed therebetween. Polymers included in the outer surface areas 230A of the plurality of photoresist patterns 130 may not be protected by acid diffused from the acid source coating layer 150 so that the outer surface areas 230A may be in a soluble state by a developing solution including an alkaline aqueous solution.

Figure 3B:
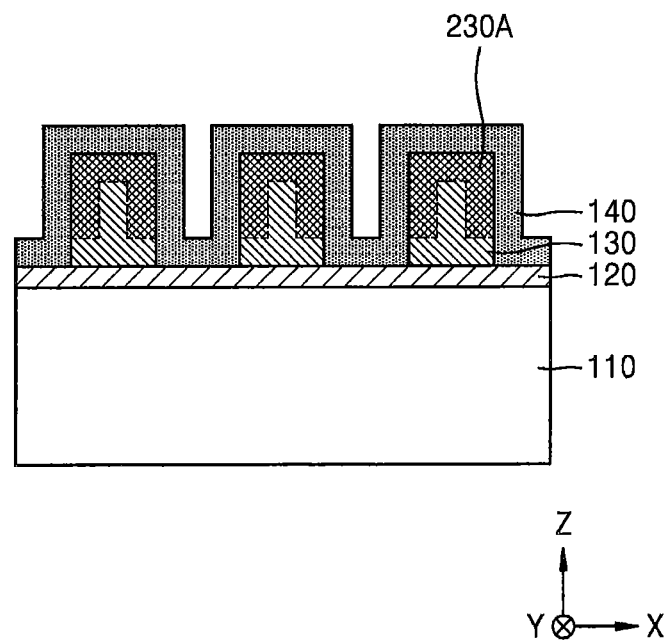

Referring to FIG. 3B, a top surface of the porous film 140 is exposed by removing the acid source coating layer 150 remaining on the porous film 140.

A wet etching process may be used to remove the acid source coating layer 150. In some embodiments, a TMAH aqueous solution may be used to remove the acid source coating layer 150.

Figure 3C:
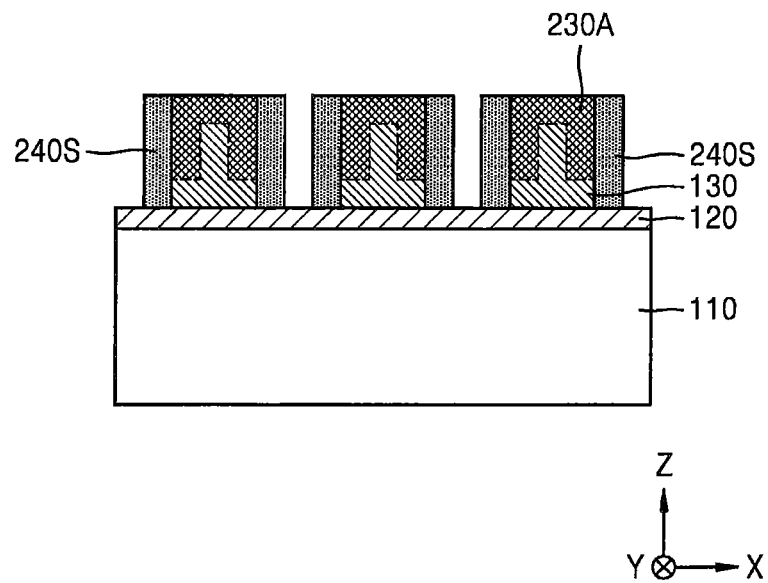

Referring to FIG. 3C, the top surfaces of the plurality of photoresist patterns 130 including the outer surface areas 230A that is in the soluble state by the developing solution are exposed by removing a part of the porous film 140.

In some embodiments, an etchback process may be used to remove the part of the porous film 140. After the part of the porous film 140 is removed, the porous film 140 may be separated as a plurality of porous spacers 240S. The plurality of porous spacers 240S may be used to expose the outer surface areas 230A of the top surfaces of the plurality of photoresist patterns 130 and a top surface of the feature layer 120.

Figure 3D:
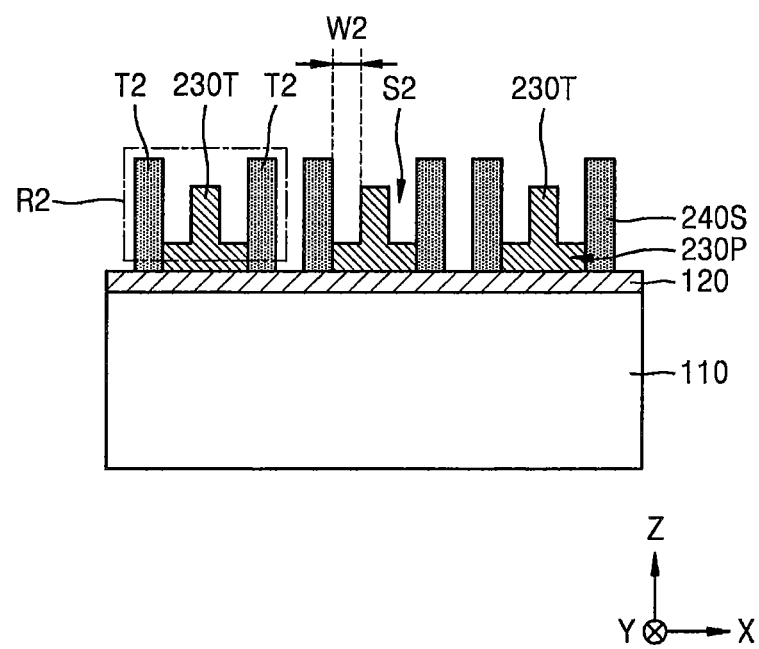

Referring to FIG. 3D, in a similar manner as described with reference to FIG. 2F above, the outer surface areas 230A are removed from the plurality of photoresist patterns 130 by developing the plurality of photoresist patterns 130 by using the alkaline aqueous solution. As a result, reduced photoresist patterns 230P that are remaining parts of the plurality of photoresist patterns 130 may be obtained.

The reduced photoresist patterns 230P may correspond to inner mask patterns formed in process P20 of FIG. 1. After the reduced photoresist patterns 230P are formed, a space S2 having a second width W2 may be formed in a first direction (in an X direction of FIG. 3D) between the reduced photoresist patterns 230P and the plurality of porous spacers 240S. In some embodiments, the second width W2 of the space S2 may have the same size as the feature size 1F of a pattern that is to be finally formed but the inventive concept is not limited thereto.

The reduced photoresist patterns 230P may include a protrusion 230T for an etching mask having the width 1F.

As shown in a dotted area R2 of FIG. 3D, the plurality of porous spacers 240S include a pair of tripling portions T2, respectively, facing both side walls of the protrusion 230T of the reduced photoresist patterns 230P in locations spaced apart from the both side walls.

Thereafter, in a similar manner as described with reference to FIGS. 2G and 2H above, the plurality of feature patterns 120P are formed by etching the feature layer 120 by using at least a part of the reduced photoresist patterns 230P and the plurality of porous spacers 240S as a mask.

The method of manufacturing the semiconductor device described with reference to FIGS. 3A through 3D may obtain a pattern tripling effect of separating one of the photoresist patterns 130 into three patterns in the first direction (in the X direction of FIG. 3D). As such, patterns repeatedly formed at a micro pitch exceeding a resolution limitation of a photolithography process by using the triple patterning process may be formed by using a low-cost and/or simplified process that uses a single photolithography process. Thus, the semiconductor device having various structures may be more readily formed by using the simplified process, and productivity may be increased by reducing a processing cost.

FIGS. 4A through 4G are cross-sectional views sequentially showing a method of manufacturing a semiconductor device, according to other embodiments of the inventive concept. The same reference numerals between FIGS. 4A through 4G and FIGS. 2A through 3D denote the same elements, and thus detailed descriptions thereof are omitted here.

The method of FIGS. 4A through 4G is generally similar to that of FIGS. 3A through 3D, except that the method of FIGS. 4A through 4G further includes a process of forming a capping film 342 (see FIG. 4E) on a porous film 340 after covering the plurality of photoresist patterns 130 with the porous film 340 (see FIGS. 4A through 4C) and inducing a chemical reaction of the plurality of photoresist patterns 130 before developing the plurality of photoresist patterns 130.

Figure 4A:
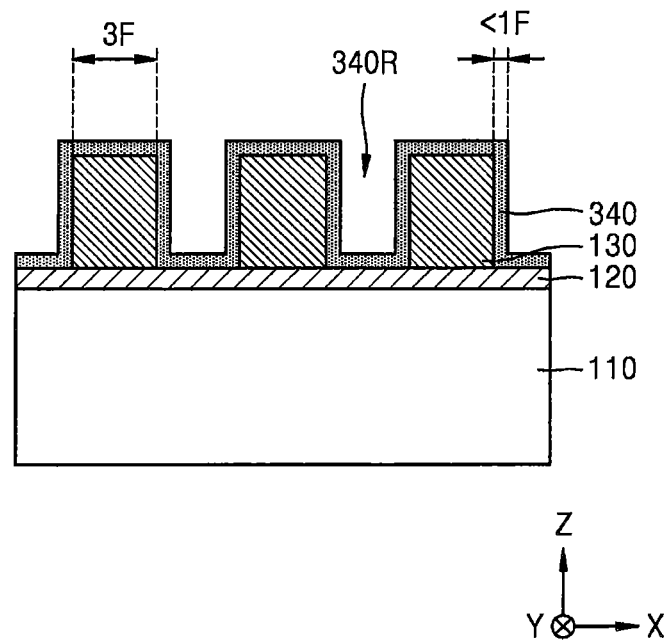
FIGS. 4A through 4G are cross-sectional views sequentially showing a method of manufacturing a semiconductor device, according to other embodiments of the inventive concept.

Referring to FIG. 4A, in the same manner as described with reference to FIGS. 2A through 2C above, after the feature layer 120 and the plurality of photoresist patterns 130 are sequentially formed on the substrate 110, the porous film 140 is formed on the etching target film 120 and covers the plurality of photoresist patterns 130.

The porous film 340 has generally the same configuration as that of the porous film 140 described with reference to FIG. 2B above. However, the porous film 340 may be formed to cover at least side walls of the plurality of photoresist patterns 130 with a width smaller than about 1F (<1F). Accordingly, after the porous film 340 is formed, recessed areas 340R having a width greater than about 1F may be formed in the porous film 340 in spaces between the plurality of photoresist patterns 130.

Figure 4B:
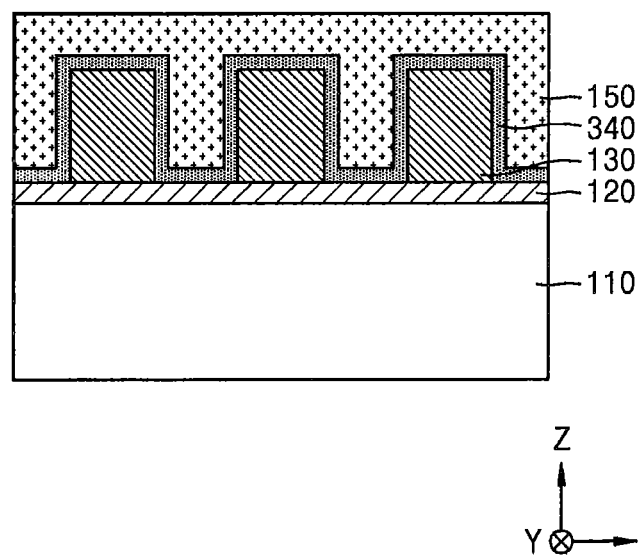

Referring to FIG. 4B, the acid source coating layer 150 is formed on the porous film 340.

Figure 4C:
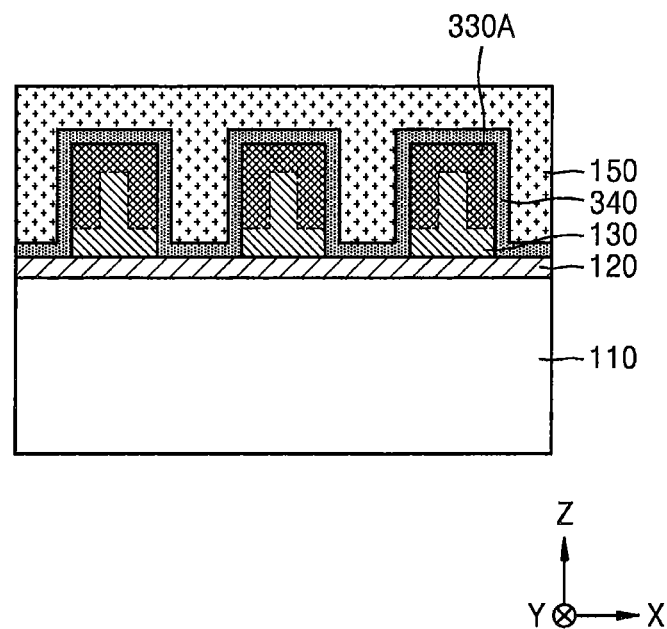

Referring to FIG. 4C, in a similar manner as described with reference to FIG. 2E above, a chemical reaction of the plurality of photoresist patterns 130 is induced in outer surface areas 330A of the plurality of photoresist patterns 130 by diffusing the acid sources in the outer surface areas 330A from the acid source coating layer 150 through the porous film 340.

The outer surface areas 330A may include the side walls and top surfaces of the plurality of photoresist patterns 130 facing the acid source coating layer 150 having the porous film 340 interposed therebetween. Polymers included in the outer surface areas 330A of the plurality of photoresist patterns 130 may not be protected by acid diffused from the acid source coating layer 150 so that the outer surface areas 330A may be in a soluble state at least due to a developing solution including an alkaline aqueous solution.

Figure 4D:
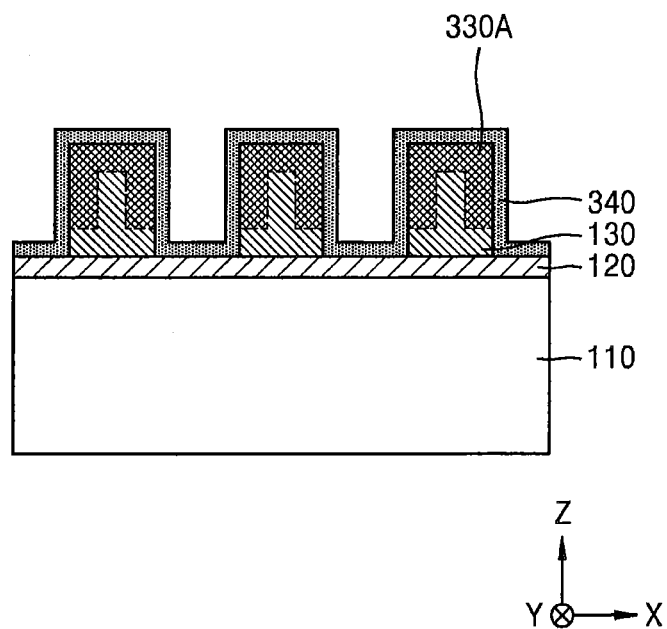

Referring to FIG. 4D, as described with reference to FIG. 3B above, a top surface of the porous film 340 is exposed by removing the acid source coating layer 150 remaining on the porous film 340.

Figure 4E:
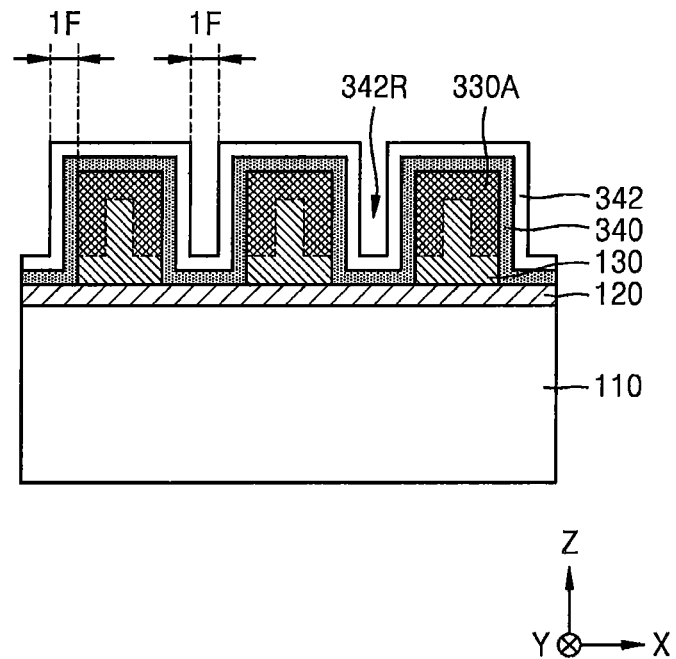

Referring to FIG. 4E, the capping film 342 covering the porous film 340 is formed.

The capping film 342 may be formed of an oxide film, a nitride film, an oxynitride film, a polysilicon film, or a combination of these. In some embodiments, the capping film 342 may be formed of the same material as that of the porous film 340. In some embodiments, the capping film 342 may be formed of a different material from that of the porous film 340.

The capping film 342 may be formed to conformally cover an exposed surface of the porous film 340. For example, the capping film 342 may be formed through an ALD process. In an example, a thickness of the capping film 342 may be determined such that the porous film 340 and the capping film 342 may cover the side walls of the plurality of photoresist patterns 130 by a width of about 1F.

After the capping film 342 is formed, recess areas 342R having the width of about 1F may be formed in the capping film 342 in the spaces between the plurality of photoresist patterns 130.

Figure 4F:
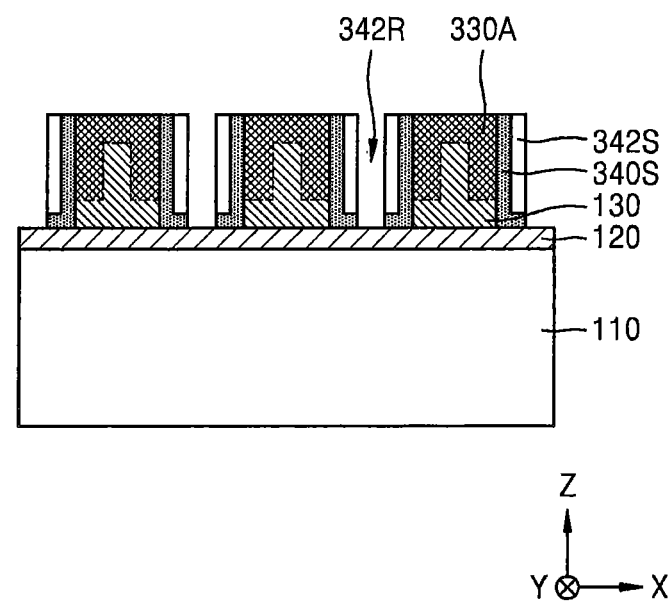

Referring to FIG. 4F, top surfaces of the plurality of photoresist patterns 130 including the outer surface areas 330A in the soluble state at least due to the developing solution are exposed by removing a part of each of the porous film 340 and the capping film 342.

In some embodiments, an etchback process may be used to remove the part of each of the porous film 340 and the capping film 342. After the part of each of the porous film 340 and the capping film 342 is removed, the porous film 340 and the capping film 342 may be respectively separated into a plurality of porous spacers 340S and a plurality of capping spacers 342S. The outer surface areas 330A of the top surfaces of the plurality of photoresist patterns 130 and a top surface of the feature layer 120 may be exposed through the plurality of porous spacers 340S and the plurality of capping spacers 342S.

Figure 4G:
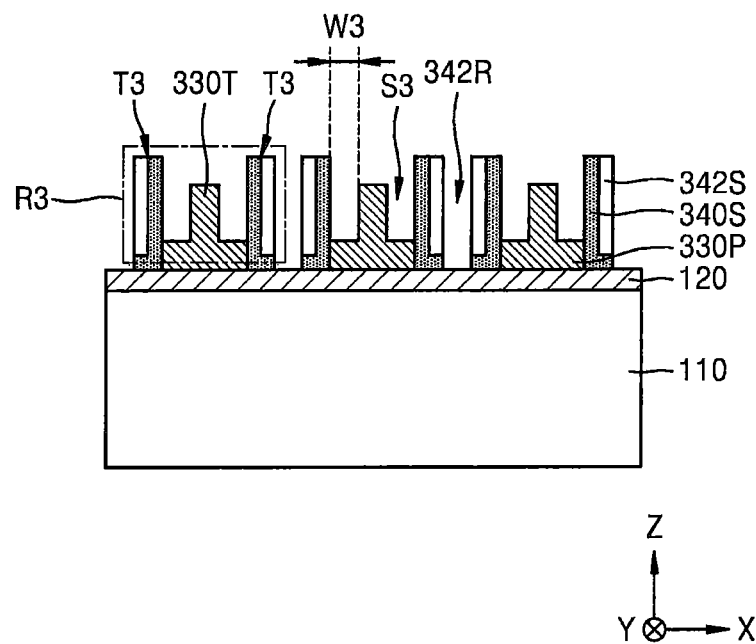

Referring to FIG. 4G, in a similar manner as described with reference to FIG. 2F or 3D above, reduced photoresist patterns 330P that are remaining parts of the plurality of photoresist patterns 130 may be formed by developing the plurality of photoresist patterns 130 by using the alkaline aqueous solution and removing the outer surface areas 330A from the plurality of photoresist patterns 130.

The reduced photoresist patterns 330P may correspond to inner mask patterns formed in process P20 of FIG. 1. After the reduced photoresist patterns 330P are formed, a space S3 having a third width W3 may be formed in a first direction (in an X direction of FIG. 4G) between the reduced photoresist patterns 330P and the plurality of porous spacers 340S. In some embodiments, the third width W3 of the space S3 may have the same size as the feature size 1F of a pattern that is to be finally formed but the inventive concept is not limited thereto.

The reduced photoresist patterns 330P may include a protrusion 330T for an etching mask having the width 1F.

As shown in a dotted area R3 of FIG. 4G, the porous spacers 340S and the capping spacers 342S having a double structure include the pair of tripling portions T3, respectively, facing both side walls of the protrusion 330T of the reduced photoresist patterns 330P in locations spaced apart from the both side walls.

Thereafter, in a similar manner as described with reference to FIGS. 2G and 2H above, the plurality of feature patterns 120P are formed by etching the feature layer 120 by using at least a part of the reduced photoresist patterns 330P, the plurality of porous spacers 340S and the plurality of capping spacers 342S as an etching mask.

The method of manufacturing the semiconductor device described with reference to FIGS. 4A through 4G may obtain a pattern tripling effect of separating one of the photoresist patterns 130 into three patterns in the first direction (in the X direction of FIG. 4G). As such, patterns repeatedly formed at a micro pitch exceeding a resolution limitation of a photolithography process by using the triple patterning process may be formed by using a low-cost simplified process that uses a single photolithography process. Thus, the semiconductor device having various structures may be easily formed by using the simplified process, and productivity may be increased by reducing a processing cost.

FIGS. 5A through 5F are cross-sectional views sequentially showing a method of manufacturing a semiconductor device, according to other embodiments of the inventive concept. The same reference numerals between FIGS. 5A through 5F and FIGS. 2A through 4G denote the same elements, and thus detailed descriptions thereof are omitted here.

The method of FIGS. 5A through 5F is generally similar to that of FIGS. 4A through 4G, in that the method of FIGS. 5A through 5F further includes a process of forming the capping film 342 (see FIG. 5D) on the porous film 340 before developing the plurality of photoresist patterns 130. However, the method of FIGS. 5A through 5F is generally similar to that of FIGS. 4A through 4G, in that the method of FIGS. 5A through 5F further includes the process of forming the capping film 342 (see FIG. 5D) on the porous film 340 before developing the plurality of photoresist patterns 130, except that the method of FIGS. 5A through 5F includes a process of inducing a chemical reaction of the plurality of photoresist patterns 130 when side walls of the plurality of photoresist patterns 130 are covered with the acid source coating layer 150 (see FIG. 5A) having the porous film 340 interposed therebetween, and top surfaces of the plurality of photoresist patterns 130 are not covered with the porous film 340.

Figure 5A:
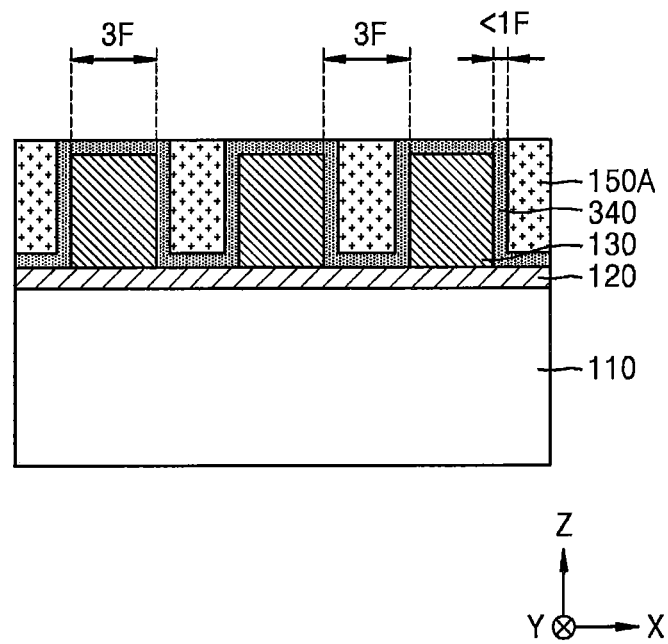
FIGS. 5A through 5F are cross-sectional views sequentially showing a method of manufacturing a semiconductor device, according to other embodiments of the inventive concept.

Referring to FIG. 5A, in the same manner as described with reference to FIGS. 4A and 4B, after the feature layer 120 that is an etching target film and the plurality of photoresist patterns 130 are sequentially formed on the substrate 110, the porous film 340 is formed on the etching target film 120 and covers the plurality of photoresist patterns 130. Thereafter, the acid source coating layer 150 is formed on the porous film 340.

Thereafter, a part of the acid coating layer 150 is removed so that a portion of the porous film 340 that covers the top surfaces of the plurality of photoresist patterns 130 may be exposed. After the part of the acid coating layer 150 is removed, a remaining acid source coating layer 150A covers side walls of each of the plurality of photoresist patterns 130 having the porous film 340 interposed therebetween. In some embodiments, an etchback process may be used to remove the part of the acid source coating layer 150 but is not limited thereto.

Figure 5B:
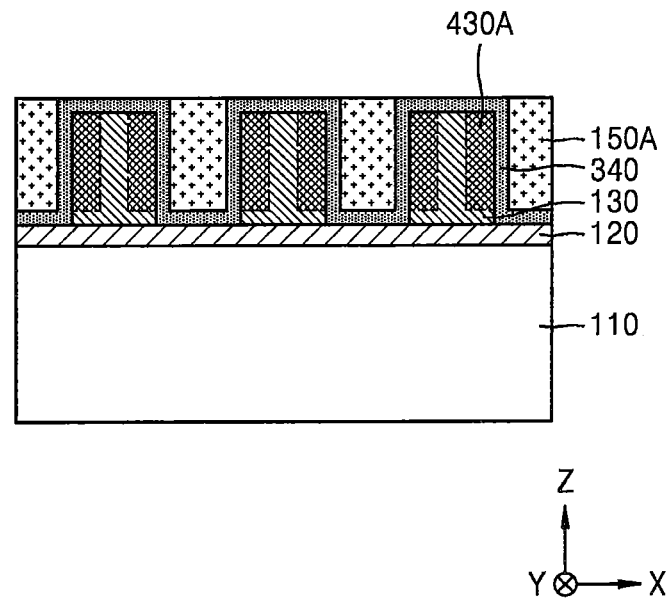

Referring to FIG. 5B, in a similar manner as described with reference to FIG. 2E above, a chemical reaction of the plurality of photoresist patterns 130 is induced in outer surface areas 430A of the plurality of photoresist patterns 130 by diffusing the acid sources in the outer surface areas 430A from the remaining acid source coating layer 150A through the porous film 340.

The outer surface areas 430A may include the side walls of the plurality of photoresist patterns 130 facing the remaining acid source coating layer 150A having the porous film 340 interposed therebetween. Polymers included in the outer surface areas 430A of the plurality of photoresist patterns 130 may not be protected by acid diffused from the remaining acid source coating layer 150A so that the outer surface areas 430A may be in a soluble state at least due to a developing solution including an alkaline aqueous solution.

Figure 5C:
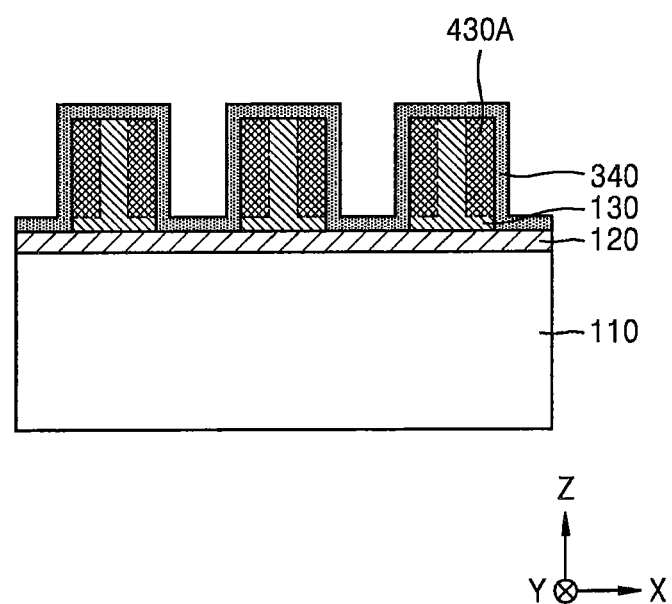
Figure 5D:
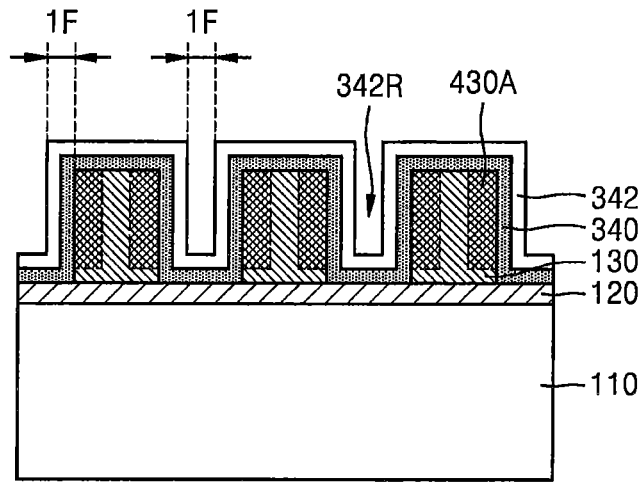

Referring to FIG. 5C, as described with reference to FIG. 4E above, the capping film 342 covering the porous film 340 is formed.

After the capping film 342 is formed, the recessed areas 342R having the width of about 1F may be formed in the capping film 342 in spaces between the plurality of photoresist patterns 130.

Figure 5E:
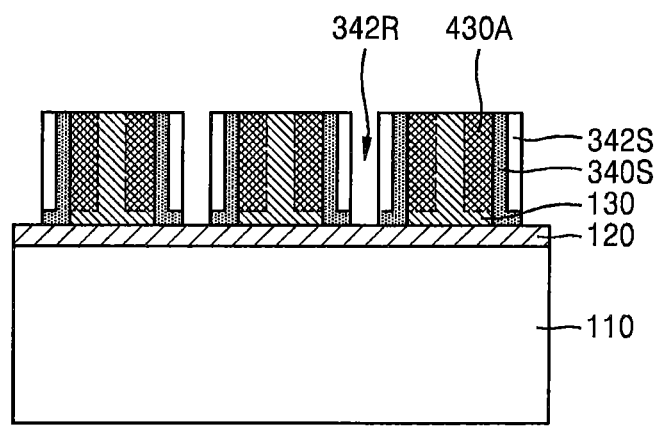

Referring to FIG. 5E, as described with reference to FIG. 4F above, top surfaces of the plurality of photoresist patterns 130 including the outer surface areas 430A in the soluble state at least due to the developing solution are exposed by removing a part of each of the porous film 340 and the capping film 342.

In some embodiments, an etchback process may be used to remove the part of each of the porous film 340 and the capping film 342. After the part of each of the porous film 34Q and the capping film 342 is removed, the porous film 340 and the capping film 342 may be respectively separated into the plurality of porous spacers 340S and the plurality of capping spacers 342S. The outer surface areas 430A of the top surfaces of the plurality of photoresist patterns 130 and a top surface of the feature layer 120 may be exposed through the plurality of porous spacers 340S and the plurality of capping spacers 342S.

Figure 5F:
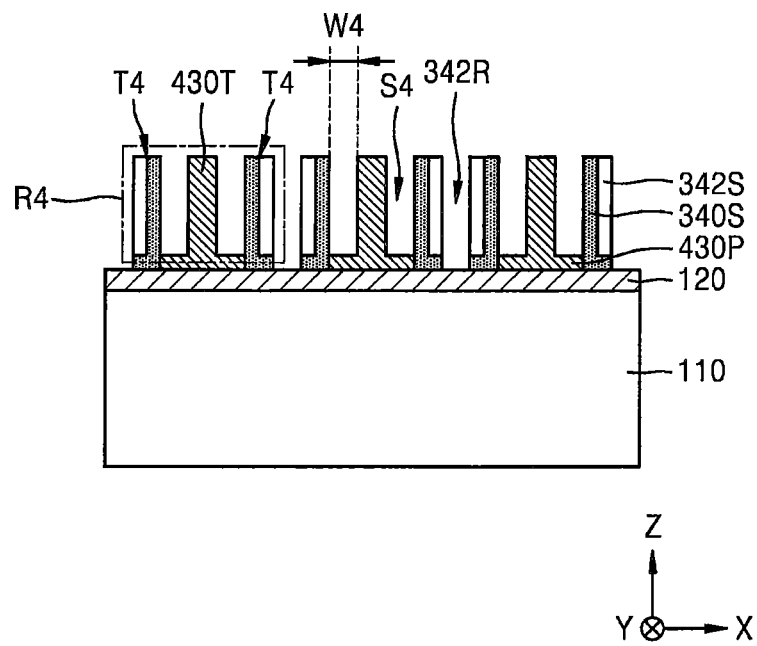

Referring to FIG. 5F, as described with reference to FIG. 4G above, reduced photoresist patterns 430P that are remaining parts of the plurality of photoresist patterns 130 may be formed by developing the plurality of photoresist patterns 130 by using the alkaline aqueous solution and removing the outer surface areas 430A from the plurality of photoresist patterns 130.

The reduced photoresist patterns 430P may correspond to inner mask patterns formed in process P20 of FIG. 1. After the reduced photoresist patterns 430P are formed, a space S4 having a fourth width W4 may be formed in a first direction (in an X direction of FIG. 5F) between the reduced photoresist patterns 430P and the plurality of porous spacers 340S. In some embodiments, the fourth width W4 of the space S4 may have the same size as the feature size 1F of a pattern that is to be finally formed but the inventive concept is not limited thereto.

The reduced photoresist patterns 430P may include a protrusion 430T for an etching mask having the width 1F. A top surface of the protrusion 430T for the etching mask may be in a first level from the substrate 110 higher than a second level from the substrate 110 of a top surface of the protrusion 330T for the etching mask of FIG. 4G.

As shown in a dotted area R4 of FIG. 5F, the porous spacers 340S and the capping spacers 342S having a double structure include a pair of tripling portions T4, respectively, facing both side walls of the protrusion 430T of the reduced photoresist patterns 430P in locations spaced apart from the both side walls.

Thereafter, in a similar manner as described with reference to FIGS. 2G and 2H above, the plurality of feature patterns 120P are formed by etching the feature layer 120 by using at least a part of the plurality of porous spacers 340S, the porous spacers 340S, and the capping spacers 342S as an etching mask.

The method of manufacturing the semiconductor device described with reference to FIGS. 5A through 5F may obtain a pattern tripling effect of separating one of the photoresist patterns 130 (see FIG. 5A) into three patterns in the first direction (in the X direction of FIG. 5F). As such, patterns repeatedly formed at a micro pitch exceeding a resolution limitation of a photolithography process by using the triple patterning process may be formed by using a low-cost and/or simplified process that uses a single photolithography process. Thus, the semiconductor device having various structures may be more readily formed by using the simplified process, and productivity may be increased by reducing a processing cost.

FIGS. 6A through 6E are cross-sectional views sequentially showing a method of manufacturing a semiconductor device, according to other embodiments of the inventive concept. The same reference numerals between FIGS. 6A through 6E and FIGS. 2A through 5F denote the same elements, and thus detailed descriptions thereof are omitted here.

The method of FIGS. 6A through 6E is generally similar to that of FIGS. 2A through 2G, except that the method of FIGS. 6A through 6E includes a process of inducing a chemical reaction of the plurality of photoresist patterns 130 when side walls and top surfaces of the plurality of photoresist patterns 130 are covered with the porous film 140 (see FIGS. 4A through 4C).

Figure 6A:
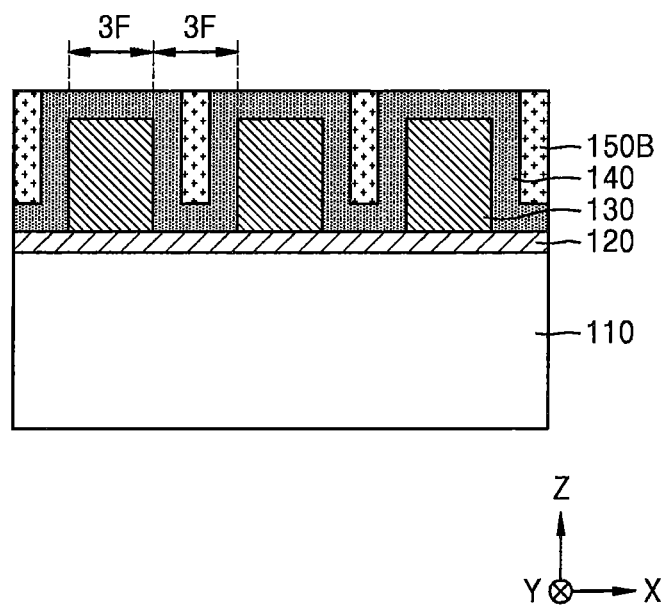
FIGS. 6A through 6E are cross-sectional views sequentially showing a method of manufacturing a semiconductor device, according to other embodiments of the inventive concept.

Referring to FIG. 6A, in the same manner as described with reference to FIGS. 2A through 2C above, after the feature layer 120 and the plurality of photoresist patterns 130 are sequentially formed on the substrate 110, the porous film 140 is formed on the etching target film 120 and covers the plurality of photoresist patterns 130. Then, the acid source coating layer 150 is formed on the porous film 140.

Thereafter, as described with reference to FIG. 5A above, a part of the acid coating layer 150 is removed so that a portion of the porous film 140 that covers the top surfaces of the plurality of photoresist patterns 130 may be exposed. After the part of the acid coating layer 150 is removed, a remaining acid source coating layer 150B covers side walls of each of the plurality of photoresist patterns 130 having the porous film 140 interposed therebetween. In some embodiments, an etchback process may be used to remove the part of the acid source coating layer 150 but is not limited thereto.

Figure 6B:
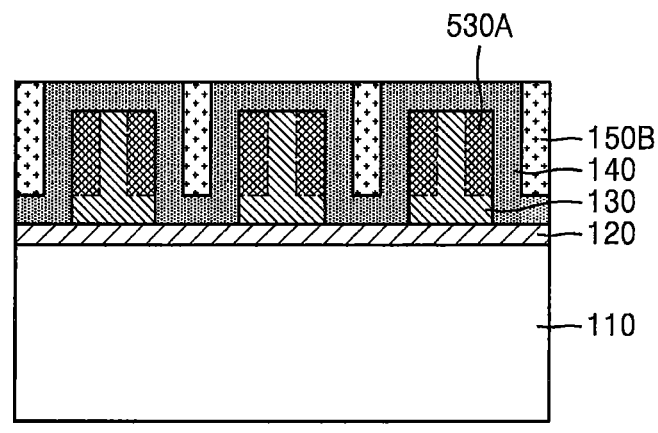
Figure 6B:
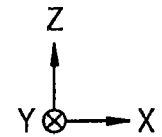

Referring to FIG. 6B, in a similar manner as described with reference to FIG. 2E above, a chemical reaction of the plurality of photoresist patterns 130 is induced in outer surface areas 530A of the plurality of photoresist patterns 130 by diffusing the acid sources n the outer surface areas 530A from the acid source coating layer 150 through the porous film 140.

The outer surface areas 530A may include the side walls of the plurality of photoresist patterns 130 facing the remaining acid source coating layer 150B having the porous film 140 interposed therebetween. Polymers included in the outer surface areas 530A of the plurality of photoresist patterns 130 may not be protected by acid diffused from the remaining acid source coating layer 150B so that the outer surface areas 530A may be in a soluble state at least due to a developing solution including an alkaline aqueous solution.

Figure 6C:
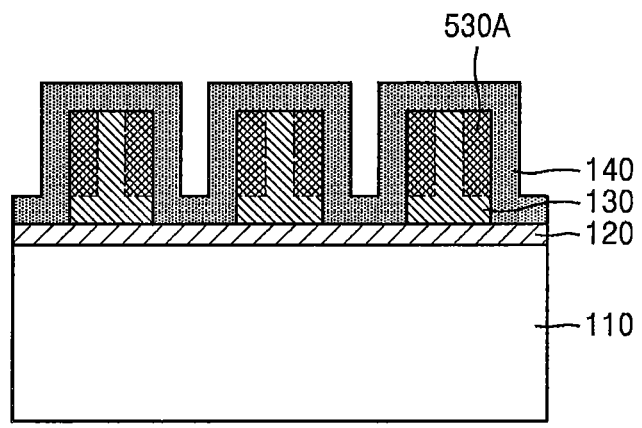
Figure 6C:
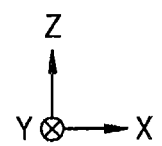

Referring to FIG. 6C, a top surface of the porous film 140 is exposed by removing the acid source coating layer 150B remaining on the porous film 340.

Figure 6D:
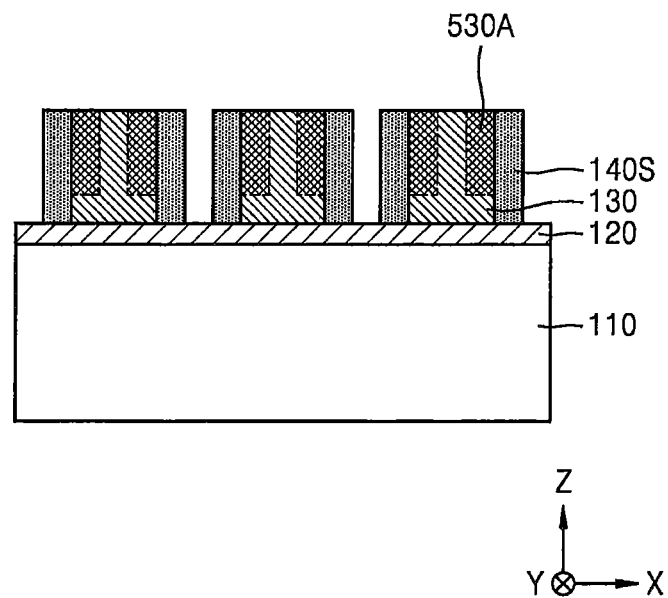

Referring to FIG. 6D, top surfaces of the plurality of photoresist patterns 130 including the outer surface areas 530A in the soluble state at least due to the developing solution are exposed by removing a part of the porous film 140.

In some embodiments, an etchback process may be used to remove the part of the porous film 140. After the part of the porous film 140 is removed, the porous film 140 may be separated into a plurality of porous spacers 140S. The outer surface areas 530A of the top surfaces of the plurality of photoresist patterns 130 and a top surface of the feature layer 120 may be exposed through the plurality of porous spacers 140S.

Figure 6E:
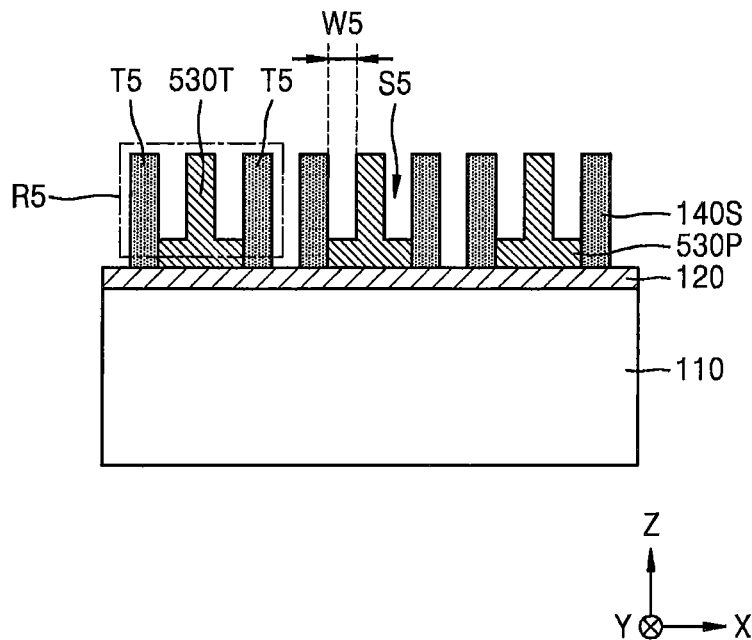

Referring to FIG. 6E, in a similar manner as described with reference to FIG. 2F above, reduced photoresist patterns 530P that are remaining parts of the plurality of photoresist patterns 130 may be formed by developing the plurality of photoresist patterns 130 by using the alkaline, aqueous solution and removing the outer surface areas 530A from the plurality of photoresist patterns 130.

The reduced photoresist patterns 530P may correspond to inner mask patterns formed in process P20 of FIG. 1. After the reduced photoresist patterns 530P are formed, a space S5 having a fifth width W5 may be formed in a first direction (in an X direction of FIG. 6E) between the reduced photoresist patterns 530P and the plurality of porous spacers 140S. In some embodiments, the fifth width W5 of the space S5 may have the same size as the feature size 1F of a pattern that is to be finally formed but the inventive concept is not limited thereto.

The reduced photoresist patterns 530P may include a protrusion 530T for an etching mask having the width 1F.

As shown in a dotted area R5 of FIG. 6E, the plurality of porous spacers 140S include a pair of tripling portions T5, respectively, facing both side walls of the protrusion 530T of the reduced photoresist patterns 530P in locations spaced apart from the both side walls.

Thereafter, in a similar manner as described with reference to FIGS. 2G and 2H above, the plurality of feature patterns 120P are formed by etching the feature layer 120 by using at least a part of the reduced photoresist patterns 530P and the plurality of porous spacers 140S as an etching mask.

The method of manufacturing the semiconductor device described with reference to FIGS. 6A through 6E may obtain a pattern tripling effect of separating one of the photoresist patterns 130 into three patterns in the first direction (in the X direction of FIG. 6E). As such, patterns repeatedly formed at a micro pitch exceeding a resolution limitation of a photolithography process by using the triple patterning process may be formed by using a low-cost and/or simplified process that uses a single photolithography process. Thus, the semiconductor device having various structures may be more readily formed by using the simplified process, and productivity may be increased by reducing a processing cost.

FIGS. 7A through 7I are cross-sectional views sequentially showing a method of manufacturing a semiconductor device, according to other embodiments of the inventive concept. The same reference numerals between FIGS. 7A through 7I and FIGS. 2A through 6E denote the same elements, and thus detailed descriptions thereof are omitted here.

The method of FIGS. 7A through 7I further includes a process of forming acid anti-diffusion barrier patterns 632A (see FIG. 7A) covering top surfaces of a plurality of first photoresist patterns 630A before forming the porous film 140.

Figure 7A:
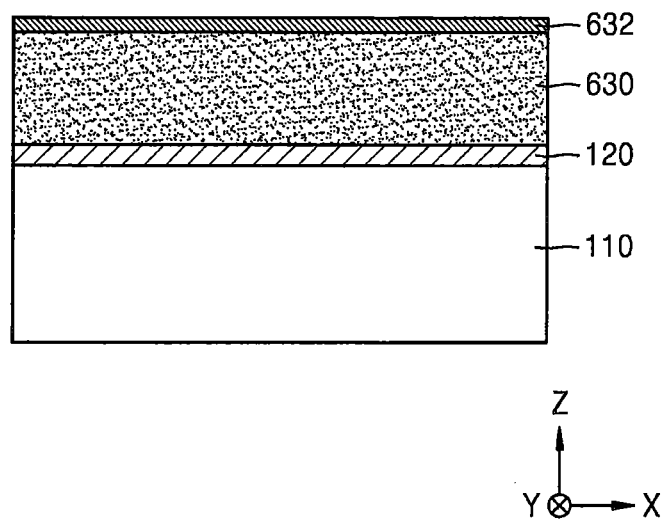
FIGS. 7A through 7I are cross-sectional views sequentially showing a method of manufacturing a semiconductor device, according to other embodiments of the inventive concept.

Referring to FIG. 7A, the feature 120, the first photoresist films 630, and an anti-diffusion barrier film 632 are sequentially formed on the substrate 110.

The anti-diffusion barrier film 632 may include an organic compound containing silicon. In some embodiments, the anti-diffusion barrier film 632 may include an organic film including an organic-silane-based polycondensation compound of a compound expressed in an equation $[R^1O]_3Si-X$, $[R^2O]_3Si-R^3$, or $[R^4O]_3Si-Si[OR^5]_3$. In the equation above, each of R1, R2, R4 and R5 is a substituted or unsubstituted C1 to C6 alkyl group, X is a substituted or unsubstituted aryl group of C6 to C30, and $R^3$ is a substituted or unsubstituted C1 to C12. The alkyl group may be a linear or branched alkyl group. The anti-diffusion barrier film 632 may have a thickness of about 200~about 5000 Å but is not limited thereto.

Figure 7B:
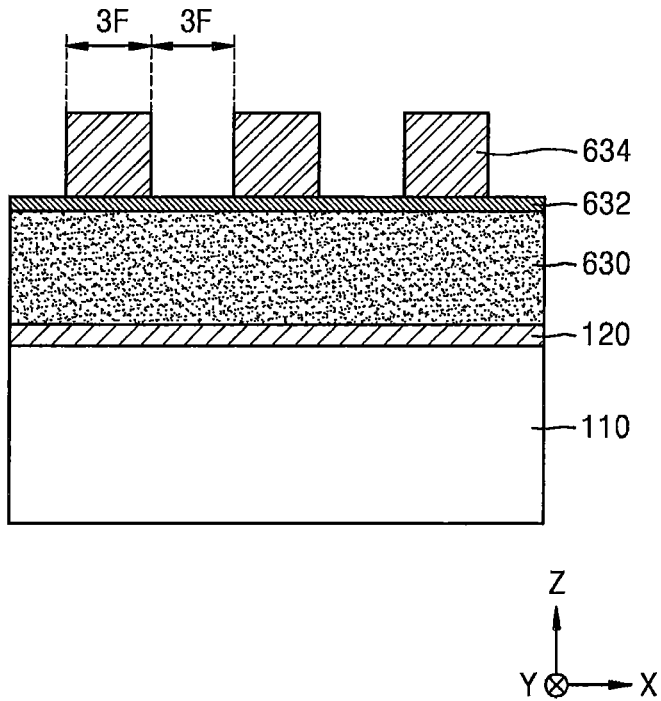

Referring to FIG. 7B, a plurality of second photoresist patterns 634 is formed on the anti-diffusion barrier film 632.

The plurality of second photoresist patterns 634 may have a width 3F that is three times the feature size 1F of a pattern that is to be finally formed in the substrate 110 in a first direction (an X direction of FIG. 7B). The plurality of second photoresist patterns 634 may be spaced apart from each other by a space having the width 3F.

Planar shapes of the plurality of second photoresist patterns 634 may include a plurality of line patterns in parallel extending in a second direction (a Y direction of FIG. 7B). However, the inventive concept is not limited to planar shapes, and the plurality of second photoresist patterns 634 having various planar shapes may be formed.

Figure 7C:
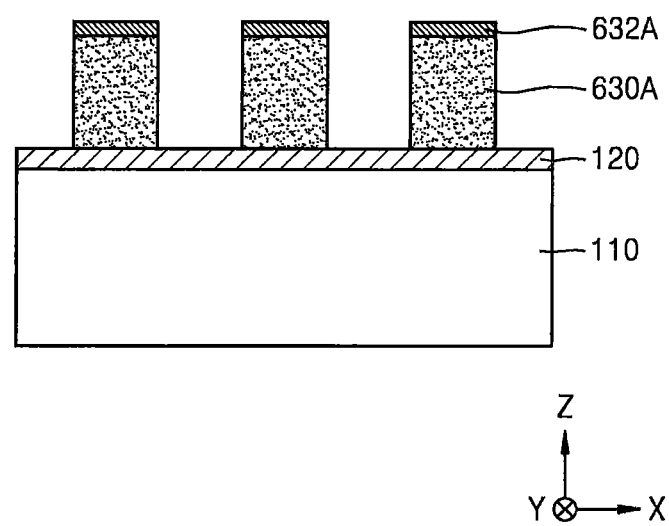

Referring to FIG. 7C, the first photoresist films 630 and the anti-diffusion barrier patterns 632A may be formed by aeolotropically etching the anti-diffusion barrier film 632 and the first photoresist films 630 by using the plurality of second photoresist patterns 634 (see FIG. 7B) as an etching mask.

Thereafter, top surfaces of the anti-diffusion barrier patterns 632A are exposed by removing the plurality of second photoresist patterns 634.

Figure 7D:
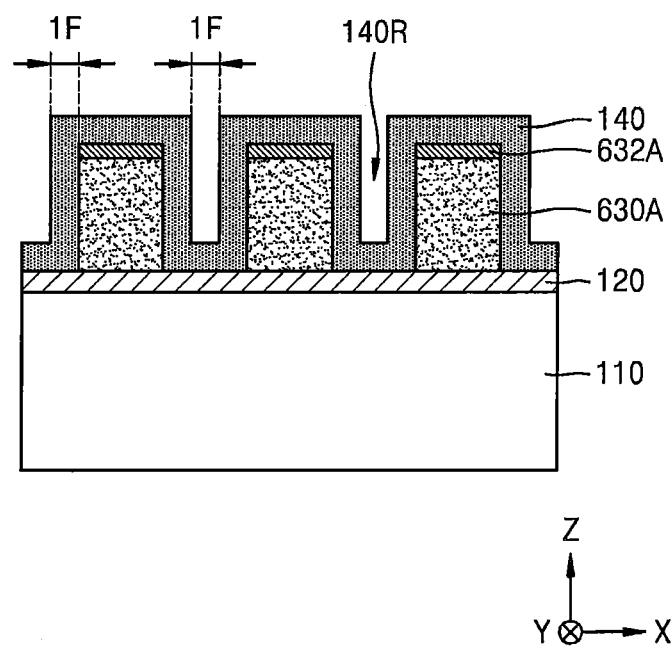

Referring to FIG. 7D, the porous film 140 covering the plurality of first photoresist patterns 630A and the anti-diffusion barrier patterns 632A is formed on the etching target film 120.

The porous film 140 may be formed to cover side walls of the plurality of first photoresist patterns 630A by the width of about 1F. After the porous film 140 is formed, the recessed areas 140R having about the width 1F may be formed in the porous film 140 in spaces between the plurality of first photoresist patterns 630A and between the anti-diffusion barrier patterns 632A.

Figure 7E:
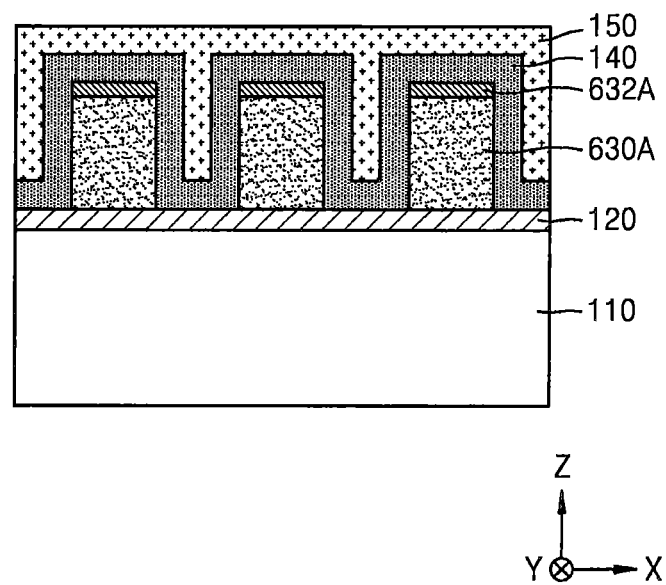

Referring to FIG. 7E, the acid source coating layer 150 is formed on the porous film 140.

Figure 7F:
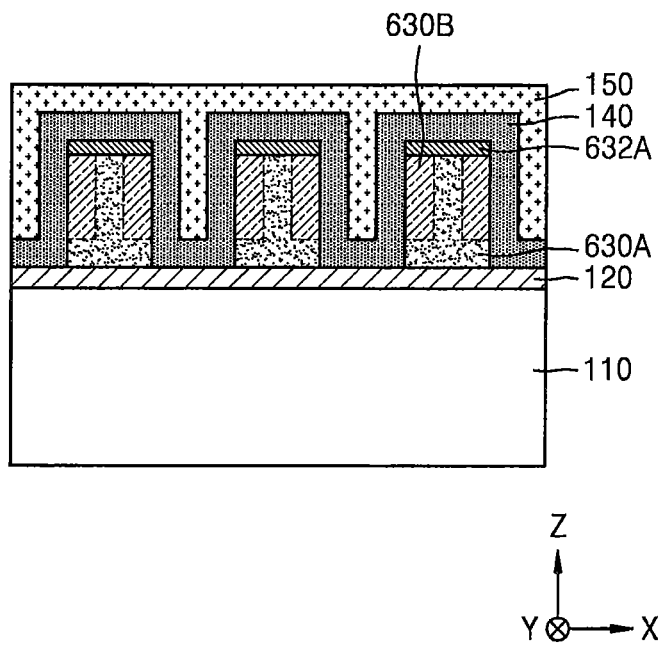

Referring to FIG. 7F, in a similar manner as described with reference to FIG. 2E above, a chemical reaction of the plurality of first photoresist patterns 630A is induced in outer surface areas 630B of the plurality of first photoresist patterns 630A by diffusing the acid sources in the outer surface areas 630B from the acid source coating layer 150 through the porous film 140.

The outer surface areas 630B may include side walls of the plurality of first photoresist patterns 630A facing the acid source coating layer 150 having the porous film 140 interposed therebetween. Although the top surfaces of the plurality of first photoresist patterns 630A face the acid source coating layer 150 having the porous film 140 interposed therebetween, diffusion of acid may be prevented from the acid source coating layer 150 to the top surfaces of the plurality of first photoresist patterns 630A at least because of the anti-diffusion barrier patterns 632A disposed between the top surfaces of the plurality of first photoresist patterns 630A and the porous film 140. Thus, a chemical reaction of the plurality of first photoresist patterns 630A may be induced in the outer surface areas 630B from the acid source coating layer 150 by diffusing the acid to the outer surface areas 630B of the first photoresist patterns 630A from the side walls of the first photoresist patterns 630A through the porous film 140.

Polymers included in the outer surface areas 630B of the plurality of first photoresist patterns 630A may not be protected by acid diffused from the acid source coating layer 150 so that the outer surface areas 630B may be in a soluble state at least due to a developing solution including an alkaline aqueous solution.

Figure 7G:
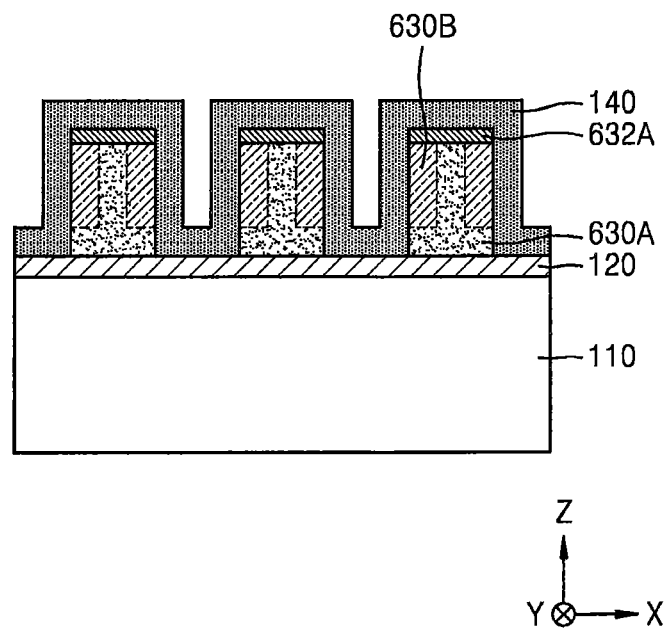

Referring to FIG. 7G, a top surface of the porous film 140 is exposed by removing the acid source coating layer 150 remaining on the porous film 140.

Figure 7H:
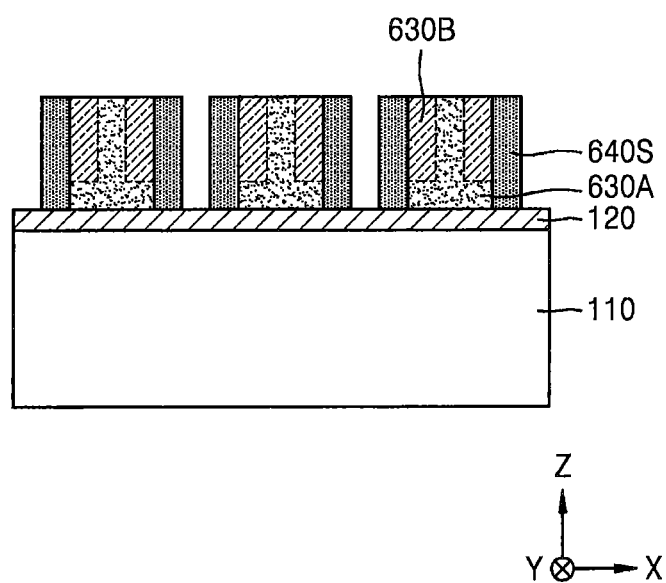

Referring to FIG. 7H, the top surfaces of the plurality of first photoresist patterns 630A including the outer surface areas 630B that is in the soluble state by the developing solution are exposed by removing a part of the porous film 140 (see FIG. 7G) and the anti-diffusion barrier patterns 632A (see FIG. 7G).

In some embodiments, an etchback process may be used to remove the part of the porous film 140 and the anti-diffusion barrier patterns 632A. After the part of the porous film 140 and the anti-diffusion barrier patterns are removed, the porous film 140 may be separated as a plurality of porous spacers 640S. The plurality of porous spacers 640S may be used to expose the outer surface areas 630B of the top surfaces of the plurality of first photoresist patterns 630A and a top surface of the feature layer 120.

Figure 7I:
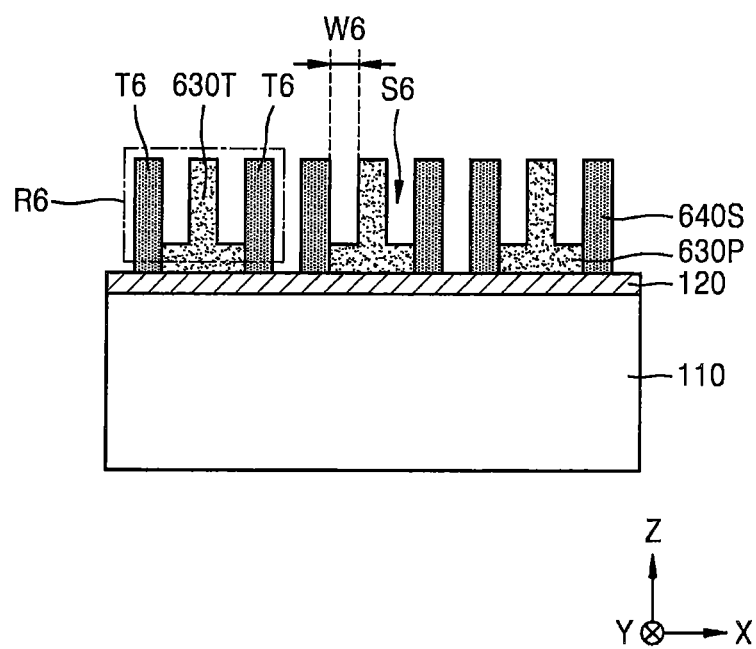

Referring to FIG. 7I, in a similar manner as described with reference to FIG. 2F above, the reduced photoresist patterns 630P that are remaining parts of the plurality of first photoresist patterns 630A may be formed by developing the plurality of first photoresist patterns 630A by using the alkaline aqueous solution and removing the outer surface areas 630B from the plurality of first photoresist patterns 630A.

The reduced photoresist patterns 630P may correspond to inner mask patterns formed in process P20 of FIG. 1. After the reduced photoresist patterns 630P are formed, a space S6 having a sixth width W6 may be formed in a first direction (in an X direction of FIG. 7I) between the reduced photoresist patterns 630P and the plurality of porous spacers 640S. In some embodiments, the sixth width W6 of the space S6 may have the same size as the feature size 1F of a pattern that is to be finally formed but the inventive concept is not limited thereto.

The reduced photoresist patterns 630P may include a protrusion 30T for an etching mask having the width 1F.

As shown in a dotted area R6 of FIG. 7I, the plurality of porous spacers 640S include a pair of tripling portions T6, respectively, facing both side walls of the protrusion 630T of the reduced photoresist patterns 630P in locations spaced apart from the both side walls.

Thereafter, in a similar manner as described with reference to FIGS. 2G and 2H above, the plurality of feature patterns 120P are formed by etching the feature layer 120 by using at least a part of the reduced photoresist patterns 630P and the plurality of porous spacers 640S as a mask.

The method of manufacturing the semiconductor device described with reference to FIGS. 7A through 7I may obtain a pattern tripling effect of separating one of the photoresist patterns 130 into three patterns in the first direction (in the X direction of FIG. 7I). As such, patterns repeatedly formed at a micro pitch exceeding a resolution limitation of a photolithography process by using the triple patterning process may be formed by using a low-cost and/or simplified process that uses a single photolithography process. Thus, the semiconductor device having various structures may be easily formed by using the simplified process, and productivity may be increased by reducing a processing cost.

Figure 8:
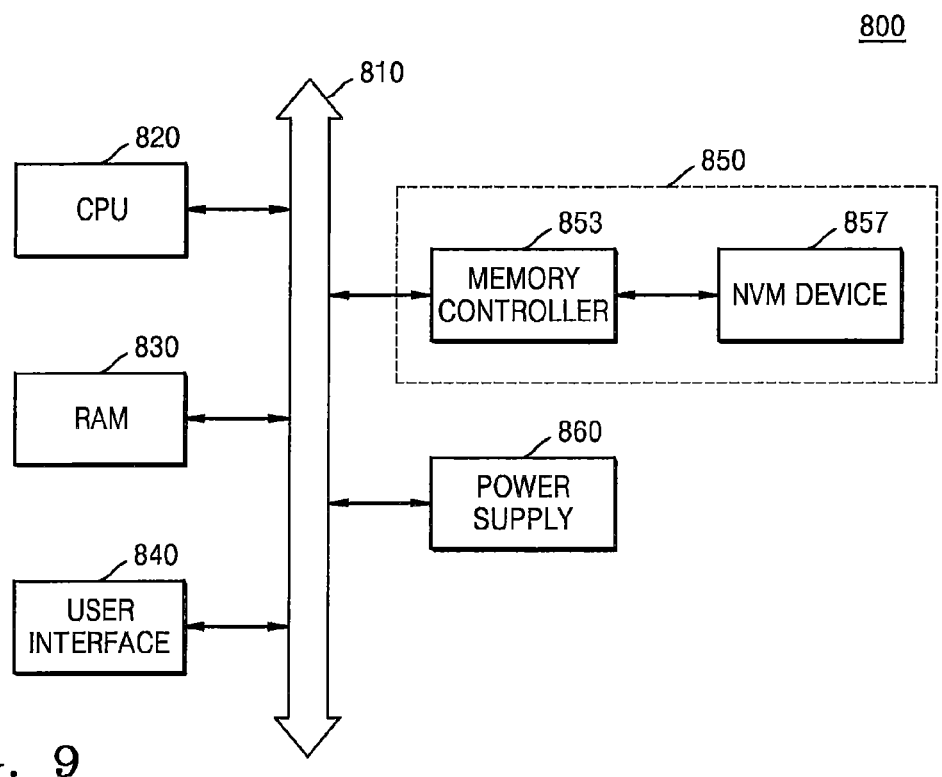
FIG. 8 is a block diagram of a memory system including a semiconductor device obtained by using a method of manufacturing the semiconductor device according to an embodiment of the inventive concept.

FIG. 8 is a block diagram of a memory system 800 including a semiconductor device obtained by using a method of manufacturing the semiconductor device according to an embodiment of the inventive concept.

Referring to FIG. 8, the memory system 800 includes a system bus 810, a central processing unit (CPU) 820, a random access memory (RAM) 830, a user interface (UI) 840, a non-volatile memory apparatus 850, and a power supply 860.

The non-volatile memory apparatus 850 is electrically connected to the memory system 800 via the system bus 810. The non-volatile memory apparatus 850 includes a memory controller 853 and a non-volatile memory apparatus 857. The non-volatile memory apparatus 857 stores data provided via the UI 840 or processed by the CPU 820 through the memory controller 853.

The memory system 800 includes the semiconductor device manufactured by using the method according to an embodiment of the inventive concept. It is obvious to one of ordinary skill in the art that an application chipset, a camera image processor, etc. may be further provided to the memory system 800.

Figure 9:
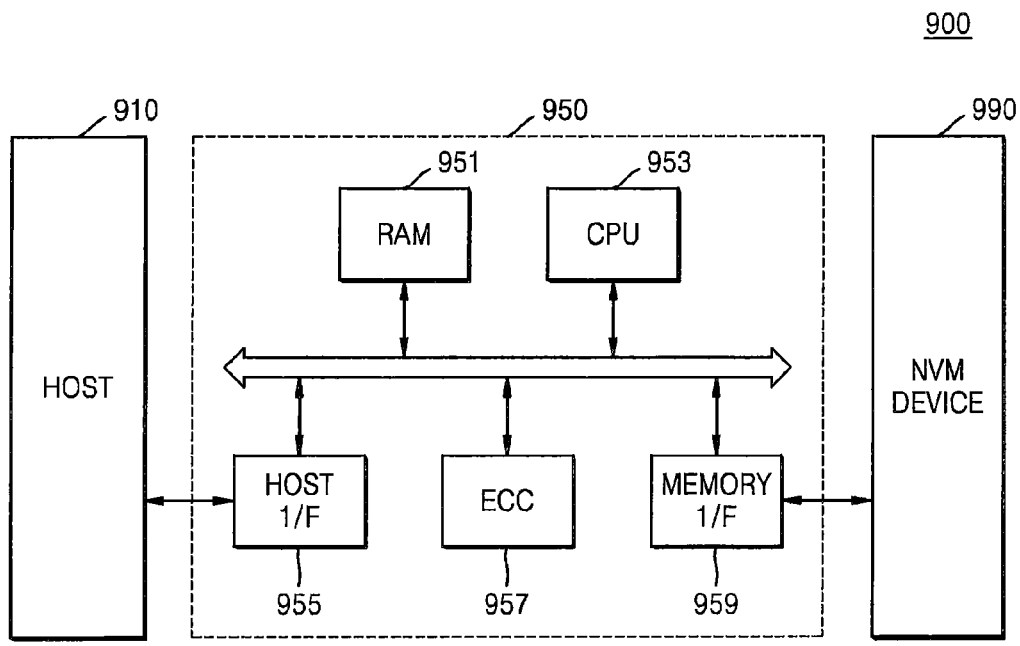
FIG. 9 is a block diagram of a memory system including a semiconductor device obtained by using a method of manufacturing the semiconductor device according to another embodiment of the inventive concept.

FIG. 9 is a block diagram of a memory system 900 including a semiconductor device obtained by using a method of manufacturing the semiconductor device according to another embodiment of the inventive concept.

Referring to FIG. 9, the memory system 900 may include a memory controller 950 and a non-volatile memory apparatus 990.

The memory controller 950 is connected to a host 910 and a non-volatile memory apparatus 990. The memory controller 950 is configured to access the non-volatile memory apparatus 990 in response to a request from the host 910. For example, the memory controller 950 is configured to control read, write, and erase operations of the non-volatile memory apparatus 990. The memory controller 950 is configured to an interface between the non-volatile memory apparatus 990 and the host 910. The memory controller 950 is configured to drive firmware for controlling the non-volatile memory apparatus 990.

The memory controller 950 may include elements such as a random access memory (RAM) 951, a CPU 953, a host interface 955, an error correcting code (CEE) 957, and a memory interface 959. The RAM 951 may be used as a working memory of the CPU 953. The CPU 953 may control a general operation of the memory controller 950.

The host interface 955 may include a protocol for performing a data exchange between the host 910 and the memory controller 950. For example, the memory controller 950 may be configured to communicate with the outside, for example, a host, through one of various interface protocols such as a USB (Universal Serial Bus) protocol, a MMC (Multimedia Card) protocol, s PCI (Peripheral Component Interconnection) protocol, s PCI-E (PCI-Express) protocol, an ATA (Advanced Technology Attachment) protocol, a SATA (Serial ATA) protocol, an SCSI (Small Computer Small Interface) protocol, an ESDI (Enhanced Small Disk Interface) protocol, and an IDE (Integrated Drive Electronics) protocol.

The ECC 957 may be configured to detect and correct an error of the data read from the. The ECC 957 may be provided as an element of the memory controller 950. As another example, the ECC 957 may be provided as an element of the non-volatile memory apparatus 990. The memory interface 959 may interface with the non-volatile memory apparatus 990. The memory system 900 may further include a read only memory (ROM) storing code data for interfacing with the host 910.

The memory controller 950 and the non-volatile memory apparatus 99Q may be integrated into a single semiconductor apparatus to configure a memory card. For example, the memory controller 950 and the non-volatile memory apparatus 990 may be integrated into the single semiconductor apparatus to configure a PCMCIA (Personal Computer Memory Card International Association) card, a CF (Compact Flash) card, a Smart Media card, a Memory Stick card, a Multi Media card (MMC, RS-MMC, MMCmicro), an SD (Secure Digital) card (SD, Mini-SD, Micro-SD, SDHC), or an UFS (Universal Flash Storage).

As another example, the memory system 900 may be applied to at least one of a semiconductor drive (Solid State Drive: SSD), a computer, a portable Computer, an UMPC (Ultra Mobile Personal Computer), a work Station, a Net Book, a PDA (Personal Digital Assistant), a Web Tablet, a Wireless Phone, a Mobile Phone, a Digital Camera, a Digital Audio Recorder, a Digital Audio Player, a Digital Video Recorder, a Digital Video Player, an E-book reader, an apparatus for transmitting and receiving information in a wireless environment, various electronic apparatuses constituting a Home Network, various electronic apparatuses constituting a Computer Network, various electronic apparatuses constituting a Telematics Network, various elements constituting a Computer System, an RFID (Radio Frequency Identification apparatus or an Embedded System.

As another example, the non-volatile memory apparatus 990 or the memory system 900 may be mounted as various forms of packages. For example, the non-volatile memory apparatus 990 or the memory system 900 may be mounted by using packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic MetricQuad Flat Pack (MQFP), Thin Quad Flatpack (TQFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

While the inventive concept has been particularly shown and described with reference to exemplary embodiments thereof, it will be understood that various changes in form and details may be made therein without departing from the spirit and scope of the following claims.

What is claimed is:

1. A method of manufacturing a semiconductor device, the method comprising:

forming an inner mask layer on an etching target film, the inner mask layer comprising a polymer;

forming a porous film on the etching target film, the porous film covering the inner mask layer;

supplying an acid source to an outer surface area of the inner mask layer through the porous film;

inducing a chemical reaction of the polymer included in the inner mask layer in the outer surface area by applying the acid source;

forming inner mask patterns by removing a chemically reacted portion of the inner mask layer; and etching the etching target film by using at least a portion of the porous film and the inner mask patterns as an etching mask.

2. The method of claim 1, wherein the porous film is formed to conformally cover exposed surfaces of the etching target film and the inner mask layer.

3. The method of claim 1, wherein the inner mask layer is formed of a chemically amplified resist including a polymer having an acid-labile protecting group.

4. The method of claim 1, wherein the acid source comprises acid, a photoacid generator (PAG), or a thermoacid generator (TAG).

5. The method of claim 1, wherein the method comprises after forming the porous film, before supplying the acid source to the outer surface area of the inner mask layer through the porous film, forming an acid source coating layer facing side walls of the inner mask layer with the porous film interposed therebetween, wherein supplying the acid source to the outer surface area comprises: diffusing the acid source included in the acid source coating layer into the inner mask layer.

6. The method of claim 1, wherein after forming the porous film, before supplying the acid source to the outer surface area of the inner mask layer through the porous film, the method further comprises:

forming an acid source coating layer facing side walls of the inner mask layer with the porous film interposed therebetween; and thermally processing the acid source coating layer.

7. The method of claim 1, wherein after forming the porous film, before supplying the acid source to the outer surface area of the inner mask layer through the porous film, the method further comprises:

forming an acid source coating layer facing side walls of the inner mask layer with the porous film interposed therebetween; and irradiating light onto the acid source coating layer.

8. The method of claim 1, wherein after forming the porous film, before supplying the acid source to the outer surface area of the inner mask layer through the porous film, the method further comprises:

forming an acid source coating layer facing side walls of the inner mask layer with the porous film interposed therebetween;

irradiating light onto the acid source coating layer; and thermally processing the acid source coating layer.

9. The method of claim 1, wherein the method further comprises after forming the porous film, before supplying the acid source to the outer surface area of the inner mask layer through the porous film, forming an acid source coating layer facing side walls of the inner mask layer with the porous film interposed therebetween, wherein the acid source coating layer is formed of a mixture of water, a soluble polymer, and the acid source.

10. The method of claim 1, wherein the porous film comprises an oxide film, a nitride film, an oxynitride film, a polysilicon film, or a combination thereof.

* * * * *